US012027615B2

(12) United States Patent
Hao et al.

(10) Patent No.: US 12,027,615 B2
(45) Date of Patent: Jul. 2, 2024

(54) SEMICONDUCTOR DEVICE AND METHOD FOR MANUFACTURING THE SAME

(71) Applicant: Innoscience (Suzhou) Technology Co., Ltd., Suzhou (CN)

(72) Inventors: Ronghui Hao, Suzhou (CN); Fu Chen, Suzhou (CN); Chuan He, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 667 days.

(21) Appl. No.: 17/144,175

(22) Filed: Jan. 8, 2021

(65) Prior Publication Data

US 2022/0199822 A1  Jun. 23, 2022

Related U.S. Application Data

(63) Continuation of application No. 17/258,462, filed as application No. PCT/CN2020/137491 on Dec. 18, 2020.

(51) Int. Cl.
*H01L 29/778* (2006.01)
*H01L 29/06* (2006.01)
(Continued)

(52) U.S. Cl.
CPC ...... *H01L 29/7787* (2013.01); *H01L 29/0646* (2013.01); *H01L 29/0649* (2013.01);
(Continued)

(58) Field of Classification Search
CPC ............ H01L 29/7787; H01L 29/0646; H01L 29/0649; H01L 29/2003; H01L 29/207;
(Continued)

(56) References Cited

U.S. PATENT DOCUMENTS 4,688,062 A  8/1987  Liles
5,144,379 A  9/1992  Eshita et al.
(Continued)

FOREIGN PATENT DOCUMENTS

CN  1750273 A  3/2006
CN  101441999 A  5/2009
(Continued)

OTHER PUBLICATIONS

International Search Report and Written Opinion of the corresponding PCT application No. PCT/CN2020/137491 dated Sep. 18, 2021.
(Continued)

*Primary Examiner* — Tu-Tu V Ho
(74) *Attorney, Agent, or Firm* — JCIPRNET

(57) ABSTRACT

A nitride-based semiconductor device includes a buffer, a first nitride-based semiconductor layer, a shield layer, a second nitride-based semiconductor layer, a pair of S/D electrodes, and a gate electrode. The first nitride-based semiconductor layer is disposed over the buffer and forms a first interface with the buffer. The shield layer includes a first isolation compound and is interposed between the buffer and the first nitride-based semiconductor layer. The first isolation compound has a bandgap greater than a bandgap of the buffer and greater than a bandgap of the first nitride-based semiconductor layer. The second nitride-based semiconductor layer is disposed on the first nitride-based semiconductor layer and has a bandgap less than the bandgap of the first isolation compound and greater than the bandgap of the first nitride-based semiconductor layer. The S/D electrodes and a gate electrode are disposed over the second nitride-based semiconductor layer.

20 Claims, 27 Drawing Sheets

(51) Int. Cl.
   *H01L 29/20*    (2006.01)
   *H01L 29/207*   (2006.01)
   *H01L 29/40*    (2006.01)
   *H01L 29/417*   (2006.01)
   *H01L 29/66*    (2006.01)
   *H01L 29/205*   (2006.01)
   *H01L 29/45*    (2006.01)

(52) U.S. Cl.
   CPC ........ *H01L 29/2003* (2013.01); *H01L 29/207* (2013.01); *H01L 29/401* (2013.01); *H01L 29/41766* (2013.01); *H01L 29/66462* (2013.01); *H01L 29/7786* (2013.01); *H01L 29/205* (2013.01); *H01L 29/452* (2013.01)

(58) Field of Classification Search
   CPC .............. H01L 29/401; H01L 29/41766; H01L 29/66462; H01L 29/7786; H01L 29/205; H01L 29/452
   USPC ........................................................ 257/194
   See application file for complete search history.

(56) References Cited

U.S. PATENT DOCUMENTS

| | | | |
|---|---|---|---|
| 8,247,844 B2 * | 8/2012 | Oishi | ................ H01L 29/66462 257/E29.247 |
| 9,698,365 B2 | 7/2017 | Seo et al. | |
| 9,723,122 B2 | 8/2017 | Ghaffari et al. | |
| 9,761,675 B1 | 9/2017 | Marinella et al. | |
| 9,765,934 B2 | 9/2017 | Rogers et al. | |
| 9,768,258 B1 | 9/2017 | Prechtl et al. | |
| 9,887,268 B2 | 2/2018 | Lu et al. | |
| 2002/0074935 A1 | 6/2002 | Kwong et al. | |
| 2002/0086180 A1 | 7/2002 | Seo et al. | |
| 2006/0194077 A1 | 8/2006 | Noguchi et al. | |
| 2006/0251919 A1 | 11/2006 | Aziz et al. | |
| 2007/0187717 A1 | 8/2007 | Sadaka et al. | |
| 2008/0135804 A1 | 6/2008 | Qiu et al. | |
| 2010/0032683 A1 | 2/2010 | Ikeda et al. | |
| 2010/0207164 A1 | 8/2010 | Shibata et al. | |
| 2010/0243991 A1 | 9/2010 | Nauka | |
| 2010/0244673 A1 | 9/2010 | Nomura et al. | |
| 2012/0223317 A1 | 9/2012 | Bahl et al. | |
| 2012/0267686 A1 | 10/2012 | Jeon et al. | |
| 2013/0075753 A1 | 3/2013 | Yamada et al. | |
| 2013/0153967 A1 | 6/2013 | Curatola et al. | |
| 2013/0248874 A1 | 9/2013 | Kuraguchi | |
| 2014/0191240 A1 | 7/2014 | Chiang et al. | |
| 2015/0115327 A1 | 4/2015 | Briere | |
| 2015/0162413 A1 | 6/2015 | Kanamura | |
| 2015/0171204 A1 | 6/2015 | Nakayama et al. | |
| 2017/0236929 A1 | 8/2017 | Green et al. | |
| 2017/0263700 A1 | 9/2017 | Stoffels et al. | |
| 2017/0271496 A1 | 9/2017 | Nakata et al. | |
| 2017/0287811 A1 | 10/2017 | Pei et al. | |
| 2017/0301781 A1 | 10/2017 | Boles et al. | |
| 2017/0317202 A1 | 11/2017 | Green et al. | |
| 2017/0365699 A1 | 12/2017 | Choi et al. | |
| 2018/0026099 A1 | 1/2018 | Miyamoto et al. | |
| 2018/0047813 A1 | 2/2018 | Prechtl et al. | |
| 2018/0061974 A1 | 3/2018 | Saito et al. | |
| 2018/0082853 A1 | 3/2018 | Birner et al. | |
| 2018/0083107 A1 | 3/2018 | Birner et al. | |
| 2018/0138306 A1 | 5/2018 | Jeon et al. | |
| 2018/0358456 A1 | 12/2018 | Iucolano et al. | |
| 2018/0358458 A1 | 12/2018 | Iucolano et al. | |
| 2019/0198796 A1 | 6/2019 | Kim et al. | |

FOREIGN PATENT DOCUMENTS

| | | |
|---|---|---|
| CN | 101689561 A | 3/2010 |
| CN | 102569423 A | 7/2012 |
| CN | 102651396 A | 8/2012 |
| CN | 102903738 A | 1/2013 |
| CN | 103367356 A | 10/2013 |
| CN | 103367420 A | 10/2013 |
| CN | 103765592 A | 4/2014 |
| CN | 104022104 A | 9/2014 |
| CN | 104659089 A | 5/2015 |
| CN | 104835847 A | 8/2015 |
| CN | 105765727 A | 7/2016 |
| CN | 106024879 A | 10/2016 |
| CN | 107170671 A | 9/2017 |
| CN | 207664048 U | 7/2018 |
| CN | 108447908 A | 8/2018 |
| CN | 109037324 A | 12/2018 |
| CN | 109712877 A | 5/2019 |
| CN | 208861993 U | 5/2019 |
| CN | 110323275 A | 10/2019 |
| CN | 111384163 A | 7/2020 |
| CN | 111682061 A | 9/2020 |
| EP | 3217433 A1 | 9/2017 |
| WO | 2020188846 A1 | 9/2020 |

OTHER PUBLICATIONS

First Office Action of the corresponding China patent application No. 202110398809.4 dated May 16, 2022.
First Office Action of the corresponding China patent application No. 202080004016.3 dated May 17, 2022.
First Office Action of the corresponding China patent application No. 202110398808.X dated May 18, 2022.
First Office Action of the corresponding China patent application No. 202110404325.6 dated May 25, 2022.
Second Office Action of corresponding China patent application No. 202110398809.4 dated Aug. 5, 2022.
United States Patent and Trademark Office, Restriction Requirement, Issued in U.S. Appl. No. 17/258,462, dated Oct. 4, 2023, 8 pages.
United States Patent and Trademark Office, Restriction Requirement, Issued in U.S. Appl. No. 17/144,177, dated Sep. 11, 2023, 7 pages.
United States Patent and Trademark Office, Non-final Office Action, Issued in U.S. Appl. No. 17/144,177, dated Nov. 16, 2023, 24 pages.
United States Patent and Trademark Office ,non-final office action, Office Action Issued in U.S. Appl. No. 17/258,462, Jan. 19, 2024, 34 pages.
State Intellectual Property Office of the People's Republic of China, Notice of Reexamination in Application No. 2021104043256, Jan. 24, 2024, 21 pages. (Submitted with Machine Translation).

* cited by examiner

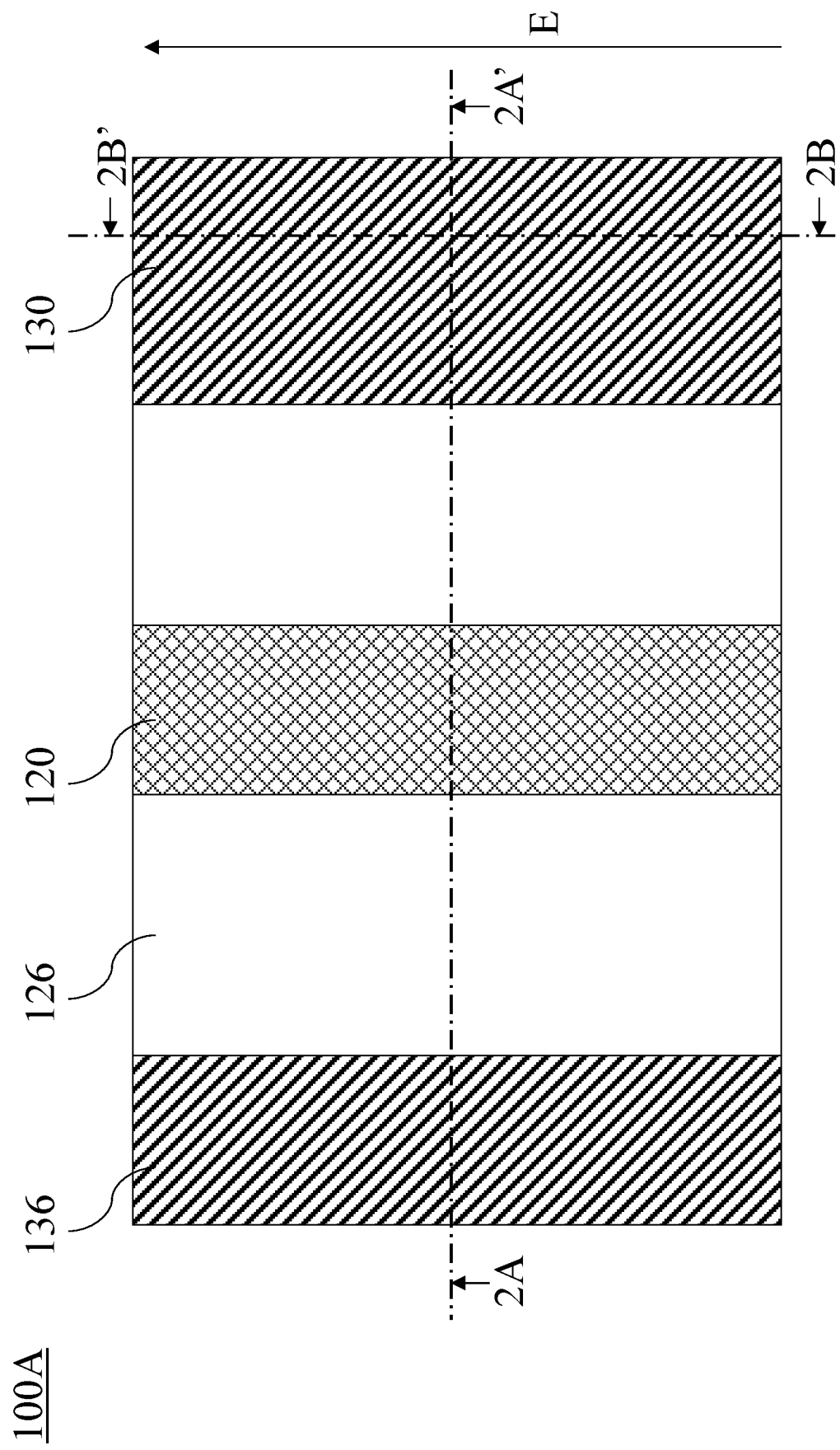

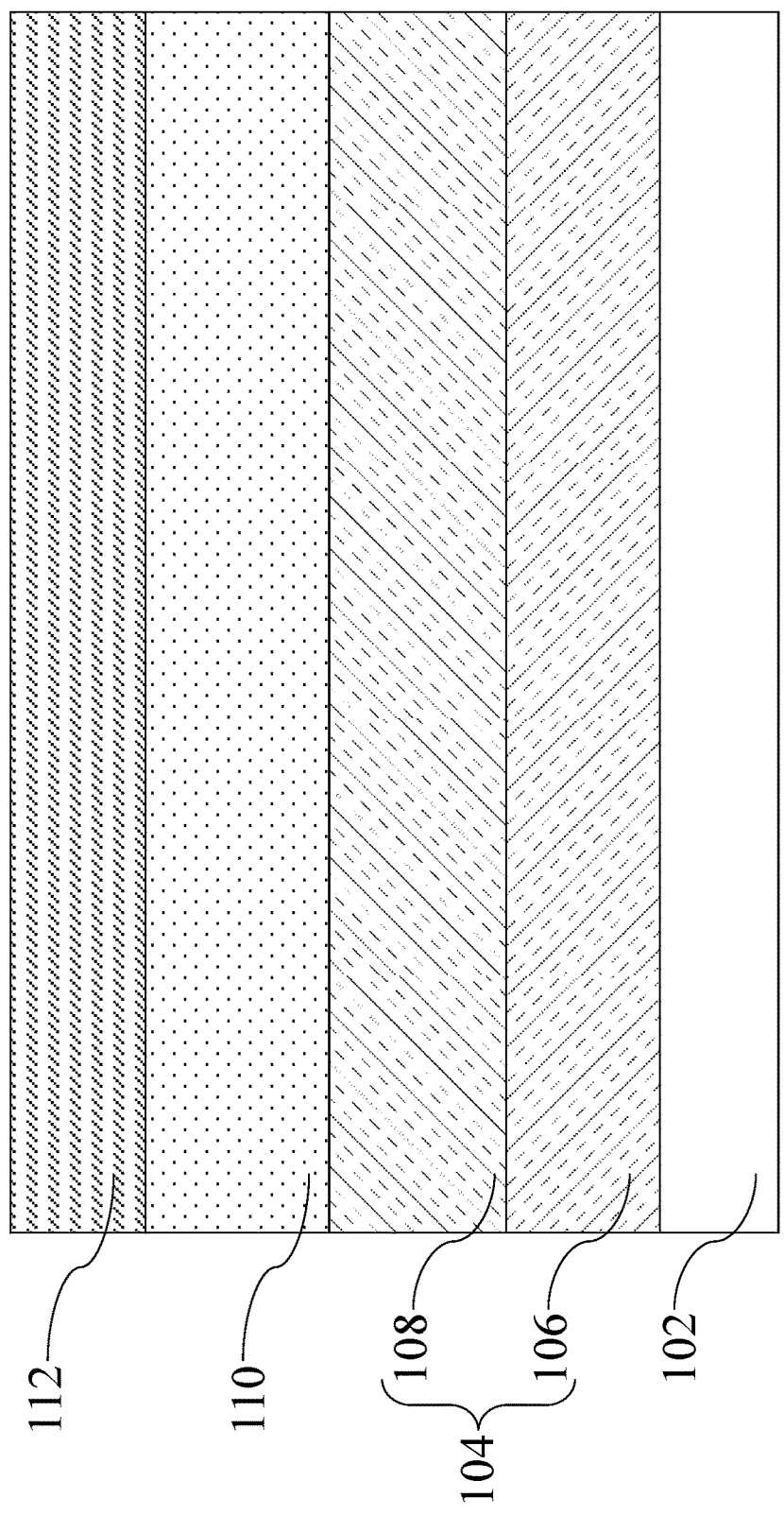

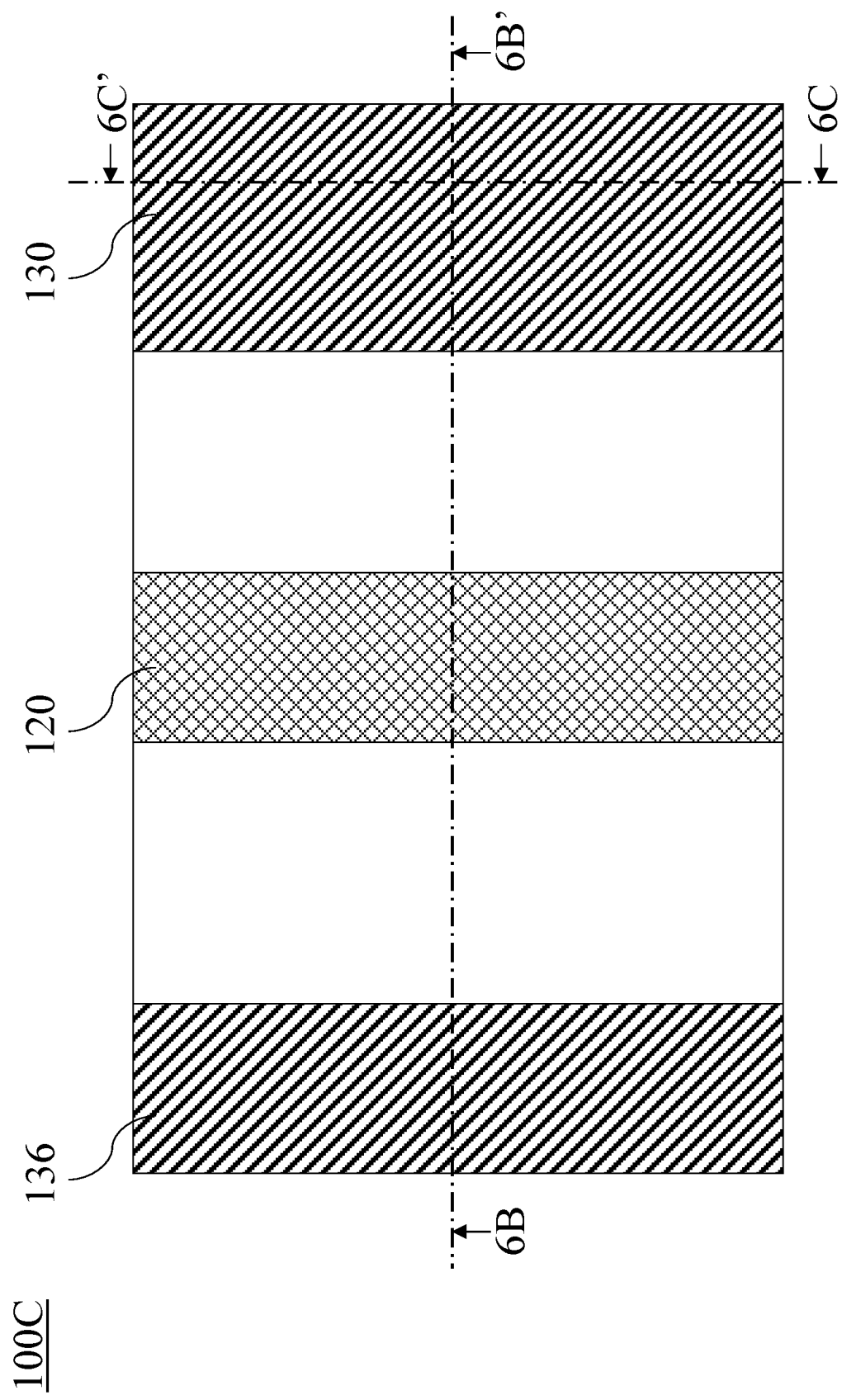

SEMICONDUCTOR DEVICE AND METHOD FOR MANUFACTURING THE SAME

CROSS-REFERENCES TO RELATED APPLICATIONS

This application is a continuation application of U.S. application Ser. No. 17/258,462, filed on Jan. 7, 2021, which is a national phase application of PCT/CN2020/137491 filed on Dec. 18, 2020, the disclosure of which are incorporated herein by reference in their entirety.

FIELD OF THE INVENTION

The present invention generally relates to a semiconductor device. More specifically, the present invention relates to a high electron mobility transistor (HEMT) semiconductor device having a source/drain extending downward or a shield layer for improving a dynamic on-resistance peak issue.

BACKGROUND OF THE INVENTION

In recent years, intense research on high-electron-mobility transistors (HEMTs) has been prevalent, particularly for high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HMET devices, thereby making them suitable for mass production.

SUMMARY OF THE INVENTION

In accordance with one aspect of the present disclosure, a nitride-based semiconductor device is provided. The nitride-based semiconductor device includes a substrate, a buffer, a first nitride-based semiconductor layer, a second nitride-based semiconductor layer, a first source/drain (S/D) electrode, a second S/D electrode, and a gate electrode. The buffer is disposed over the substrate and includes at least one layer of a nitride-based semiconductor compound doped with an acceptor at a top-most portion of the buffer. The first nitride-based semiconductor layer is disposed over the buffer. The second nitride-based semiconductor layer is disposed on the first nitride-based semiconductor layer and has a bandgap greater than a bandgap of the first nitride-based semiconductor layer. The first S/D electrode is disposed over the second nitride-based semiconductor layer, in which the first S/D electrode extends downward to a position lower than the first nitride-based semiconductor layer, so as to form at least one first interface with the top-most portion of the buffer, making contact with the at least one layer of the nitride-based semiconductor compound. The second S/D electrode is disposed over the second nitride-based semiconductor layer. The gate electrode is disposed over the second nitride-based semiconductor layer and between the first and second S/D electrodes.

In accordance with one aspect of the present disclosure, a method for manufacturing a semiconductor device is provided. The method includes steps as follows. A buffer is formed over a substrate, in which the buffer at least comprises a p-type III-V group semiconductor compound at a top-most portion thereof. A first nitride-based semiconductor layer is formed over the buffer. A second nitride-based semiconductor layer is formed on the first nitride-based semiconductor layer, in which the second nitride-based semiconductor layer has a bandgap greater than a bandgap of the first nitride-based semiconductor layer. At least one hole is formed in the first and second nitride-based semiconductor layers to expose the top-most portion of the buffer. A first S/D electrode and a second S/D electrode are formed over the second nitride-based semiconductor layer, in which the second S/D electrode is located within the hole such that the second S/D electrode forms an interface with the exposed top-most portion of the buffer. A gate electrode is formed over the second nitride-based semiconductor layer and between the first and second S/D electrodes.

In accordance with one aspect of the present disclosure, a nitride-based semiconductor device is provided, including a substrate, a buffer, a first nitride-based semiconductor layer, a second nitride-based semiconductor layer, a first S/D electrode, a second S/D electrode, and a gate electrode. The buffer is disposed over the substrate and includes at least one layer of a III-V group semiconductor compound doped with an acceptor at a top-most portion of the buffer. The first nitride-based semiconductor layer is disposed over the buffer. The second nitride-based semiconductor layer is disposed on the first nitride-based semiconductor layer and has a bandgap greater than a bandgap of the first nitride-based semiconductor layer, so as to form a two-dimensional electron gas (2DEG) region on the top-most portion of the buffer. The first S/D electrode is disposed over the second nitride-based semiconductor layer and the 2DEG region. The second S/D electrode is disposed over and in contact with the top-most portion of the buffer, in which the second S/D electrode extends upward from a first position lower than the 2DEG region to a second position higher than the 2DEG region. The gate electrode is disposed over the second nitride-based semiconductor layer and between the first and second S/D electrodes.

In accordance with one aspect of the present disclosure, a nitride-based semiconductor device is provided, including a substrate, a buffer, a first nitride-based semiconductor layer, a second nitride-based semiconductor layer, a gate electrode, a first S/D electrode, and a second S/D electrode. The buffer is disposed over the substrate and includes at least one layer of a nitride-based semiconductor compound doped with an acceptor at a top-most portion of the buffer. The first nitride-based semiconductor layer is disposed over the buffer. The second nitride-based semiconductor layer is disposed on the first nitride-based semiconductor layer and has a bandgap greater than a bandgap of the first nitride-based semiconductor layer. The gate electrode is disposed over the second nitride-based semiconductor layer. The first S/D electrode and a second S/D electrode are disposed over the second nitride-based semiconductor layer and located at opposite sides of the gate electrode, in which profiles of the first and second S/D electrodes are asymmetric with respect to the gate electrode, such that a bottom surface of the first S/D electrode is deeper than that of the second S/D electrode with respect to the gate electrode.

In accordance with one aspect of the present disclosure, a method for manufacturing a semiconductor device is provided, including steps as follows. A buffer is formed over a substrate, in which the buffer at least includes a p-type III-V group semiconductor compound at a top-most portion of the buffer. A first nitride-based semiconductor layer is formed disposed over the buffer. A second nitride-based semiconductor layer is formed on the first nitride-based semiconductor layer, in which the second nitride-based semiconductor layer has a bandgap greater than a bandgap of the first nitride-based semiconductor layer. A first source/drain S/D electrode and a second S/D electrode are formed over the second nitride-based semiconductor layer, in which the first S/D electrode is formed as being deeper than the second S/D electrode such that the first S/D electrode forms an interface with the top-most portion of the buffer. A gate electrode is formed over the second nitride-based semiconductor layer and between the first and second S/D electrodes.

In accordance with one aspect of the present disclosure, a nitride-based semiconductor device, including a substrate, a buffer, a first nitride-based semiconductor layer, a second nitride-based semiconductor layer, a first S/D electrode, a second S/D electrode, and a gate electrode. The buffer is disposed over the substrate. The first nitride-based semiconductor layer is disposed over the buffer. The second nitride-based semiconductor layer is disposed on the first nitride-based semiconductor layer and has a bandgap greater than a bandgap of the first nitride-based semiconductor layer. The first S/D electrode is disposed over the second nitride-based semiconductor layer and includes a first conformal layer and a first conductive filling. The first conformal layer extends from a position higher than the second nitride-based semiconductor layer to the buffer. The first conductive filling is disposed over the first conformal layer. The second S/D electrode is disposed over the second nitride-based semiconductor layer and includes a second conformal layer and a second conductive filling. The second conformal layer extends from a position higher than the second nitride-based semiconductor layer to the second nitride-based semiconductor layer. The second conductive filling is disposed over the second conformal layer. The gate electrode is disposed over the second nitride-based semiconductor layer and between the first and second S/D electrodes.

In accordance with one aspect of the present disclosure, a nitride-based semiconductor device is provided, including a substrate, a buffer, a first nitride-based semiconductor layer, a shield layer, a second nitride-based semiconductor layer, a pair of S/D electrodes, and a gate electrode. A buffer is disposed over the substrate. A first nitride-based semiconductor layer is disposed over the buffer. A shield layer is disposed between the buffer and the first nitride-based semiconductor layer and includes a first isolation compound that has a bandgap greater than a bandgap of the first nitride-based semiconductor layer, in which the first isolation compound is made of at least one two-dimensional material which includes at least one metal element. A second nitride-based semiconductor layer is disposed on the first nitride-based semiconductor layer and has a bandgap less than the bandgap of the first isolation compound and greater than the bandgap of the first nitride-based semiconductor layer. The pair of S/D electrodes and the gate electrode are disposed over the second nitride-based semiconductor layer. The gate electrode is present between the S/D electrodes, and vertical projections of the S/D electrodes and the gate electrode on the buffer are entirely within a vertical projection of the shield layer on the buffer.

In accordance with one aspect of the present disclosure, a nitride-based semiconductor device, including a substrate, a buffer, a first nitride-based semiconductor layer, a shield layer, a second nitride-based semiconductor layer, a pair of S/D electrodes, and a gate electrode. The buffer is disposed over the substrate. The first nitride-based semiconductor layer is disposed over the buffer. The shield layer is disposed between the buffer and the first nitride-based semiconductor layer and includes a first isolation compound that has a bandgap greater than a bandgap of the first nitride-based semiconductor layer. The first isolation compound at least includes a group III element and oxygen. The second nitride-based semiconductor layer is disposed on the first nitride-based semiconductor layer and has a bandgap less than the bandgap of the first isolation compound and greater than the bandgap of the first nitride-based semiconductor layer. The S/D electrodes and the gate electrode are disposed over the second nitride-based semiconductor layer. The gate electrode is present between the S/D electrodes, and vertical projections of the S/D electrodes and the gate electrode on the buffer are entirely within a vertical projection of the shield layer on the buffer.

In accordance with one aspect of the present disclosure, a method for manufacturing a semiconductor device is provided, including steps as follows. A buffer is formed over a substrate. A shield layer is formed over a buffer to form an interface with the buffer structure, in which the shield layer includes an isolation compound which is made of at least one two-dimensional material which comprising at least one metal element. A first nitride-based semiconductor layer disposed over the shield layer and having a bandgap less than a bandgap of the isolation compound is formed. A second nitride-based semiconductor layer is formed on the first nitride-based semiconductor layer, in which the second nitride-based semiconductor layer has a bandgap less than the bandgap of the isolation compound and greater than the bandgap of the first nitride-based semiconductor layer. A pair of S/D electrodes are formed over the second nitride-based semiconductor layer. A gate electrode is formed over the second nitride-based semiconductor layer and between the S/D electrodes.

In accordance with one aspect of the present disclosure, a nitride-based semiconductor device is provided, including. a substrate, a buffer, a first nitride-based semiconductor layer, a second nitride-based semiconductor layer, an isolation region, a source electrode, a drain electrode, and a gate electrode. The buffer is disposed over the substrate. The first nitride-based semiconductor layer is disposed over the buffer structure. The second nitride-based semiconductor layer is disposed on the first nitride-based semiconductor layer and has a bandgap greater than a bandgap of the first nitride-based semiconductor layer, so as to form a heterojunction therebetween with a 2DEG region. The isolation region is between the buffer and the 2DEG region. At least one path from the buffer to the 2DEG region overlaps with the isolation region, and the isolation region is formed by at least one two-dimensional material comprising at least one metal element. A source electrode, a drain electrode, and a gate electrode are disposed over the second nitride-based semiconductor layer. The gate electrode is present between the source and drain electrodes. A first path from the source electrode to the gate electrode through the 2DEG region is directly above the isolation region, and a second path from the gate electrode to the drain electrode through the 2DEG region is directly above the isolation region.

In accordance with one aspect of the present disclosure, a nitride-based semiconductor device is provided, including a substrate, a buffer, a first nitride-based semiconductor layer, a shield layer, a second nitride-based semiconductor layer, a pair of S/D electrodes, and a gate electrode. The buffer is disposed over the substrate. The first nitride-based semiconductor layer is disposed over the buffer and forms a first interface with the buffer. The shield layer includes a first isolation compound and is interposed between the buffer and the first nitride-based semiconductor layer. The first isolation compound has a bandgap greater than a bandgap of the buffer and greater than a bandgap of the first nitride-based semiconductor layer, forming at least one electrical isolation region between the buffer and the first nitride-based semiconductor layer. The second nitride-based semiconductor layer is disposed on the first nitride-based semiconductor layer and has a bandgap less than the bandgap of the first isolation compound and greater than the bandgap of the first nitride-based semiconductor layer. The pair of S/D electrodes and a gate electrode are disposed over the second nitride-based semiconductor layer, wherein the gate electrode is present between the S/D electrodes.

In accordance with one aspect of the present disclosure, a method for manufacturing a semiconductor device is provided, including steps as follows. A buffer is formed over a substrate. A shield layer is formed in contact with a buffer. The shield layer is patterned to expose portions of the buffer. A first nitride-based semiconductor layer grows from the exposed portion of the buffer, such that the first nitride-based semiconductor layer is formed to cover the shield layer, in which the first nitride-based semiconductor layer has a bandgap less than a bandgap of the isolation compound. A second nitride-based semiconductor layer is formed on the first nitride-based semiconductor layer, in which the second nitride-based semiconductor layer has a bandgap less than the bandgap of the isolation compound and greater than the bandgap of the first nitride-based semiconductor layer. Two or more of S/D electrodes are formed over the second nitride-based semiconductor layer. A gate electrode is formed over the second nitride-based semiconductor layer and between the S/D electrodes.

In accordance with one aspect of the present disclosure, a nitride-based semiconductor device, including a substrate, a buffer, a first nitride-based semiconductor layer, a second nitride-based semiconductor layer, at least one isolation region, a source electrode, a drain electrode, and a gate electrode. The buffer is disposed over the substrate. The first nitride-based semiconductor layer is disposed over the buffer and forms at least one interface with the buffer. The second nitride-based semiconductor layer is disposed on the first nitride-based semiconductor layer and has a bandgap greater than a bandgap of the first nitride-based semiconductor layer, so as to form a 2DEG region. The isolation region is interposed between the buffer and the first nitride-based semiconductor layer and abuts against the interface, such that at least one path from the buffer to the 2DEG is free from the isolation region. The source electrode, the drain electrode, and the gate electrode are disposed over the second nitride-based semiconductor layer, in which the gate electrode is present between the source and drain electrodes.

By applying the above configuration, a dynamic on-resistance peak issue can be improved. The process for manufacturing semiconductor devices with the above configuration is not complicated, resulting in a high yield rate. In the present disclosure, the solutions for improving the dynamic Ron peak issue have high compatibility with one another, which is advantageous for use in high electron mobility transistor (HEMT) semiconductor devices.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 1 is a top view of a semiconductor device according to some embodiments of the present disclosure;

FIGS. 4A-4D illustrate different stages of a method for manufacturing a semiconductor device according to some embodiments of the present disclosure;

FIG. 6A is a top view of a semiconductor device according to some embodiments of the present disclosure;

DETAILED DESCRIPTION

Figure 2A:
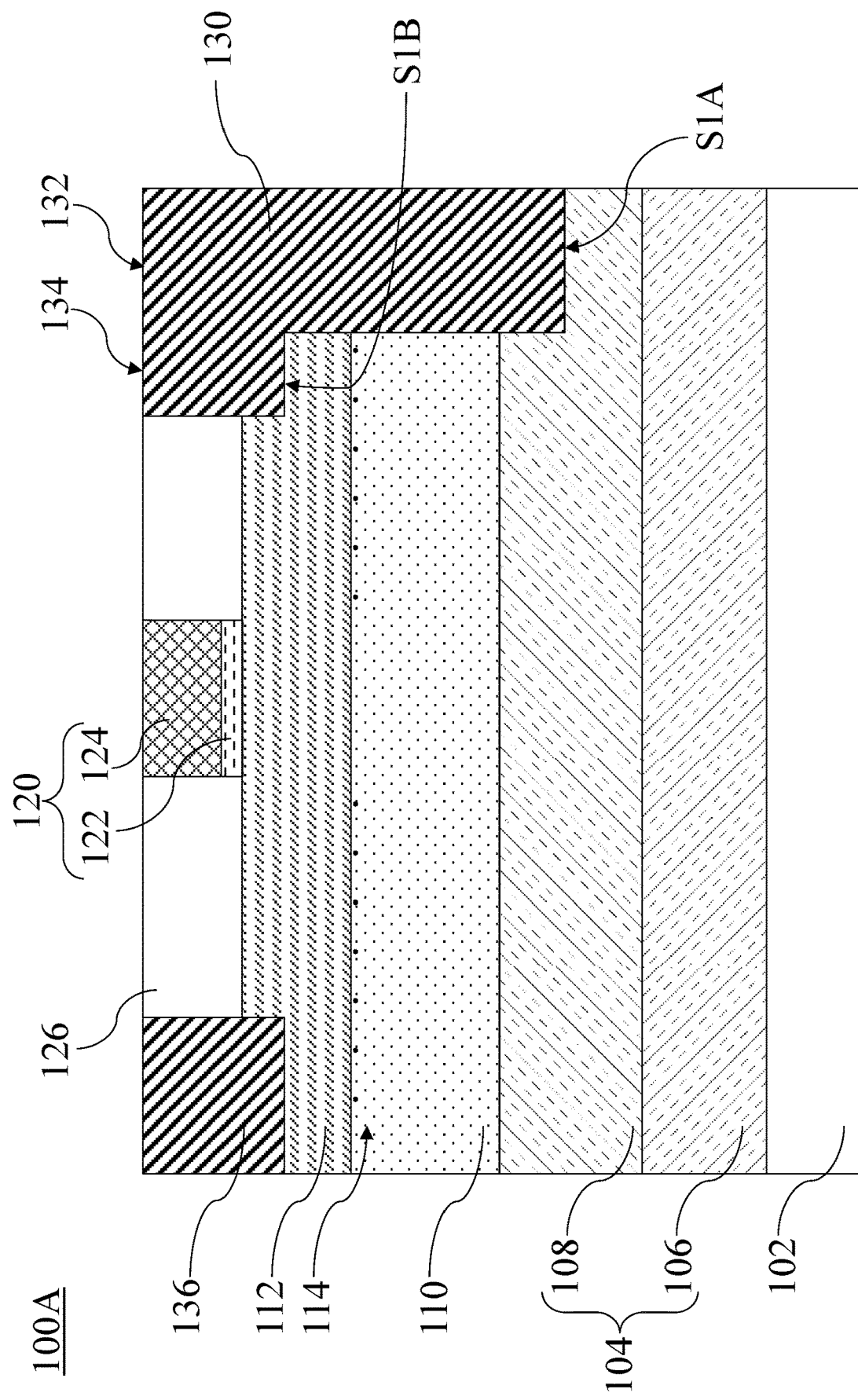
FIG. 2A is a cross-sectional view across a line 2A-2A' of the semiconductor device in FIG. 1.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/semiconductor die, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a top view of a semiconductor device 100A according to some embodiments of the present disclosure. The semiconductor device 100A includes a gate structure 120 and a pair of source/drain (S/D) electrodes 130 and 136 to construct parts of a transistor. The S/D electrodes 130 and 136 extend along an extending direction E (i.e. a vertical line in FIG. 1). The gate structure 120 is located between the S/D electrodes 130 and 136. Herein, the top view means that the gate structure 120 and the S/D electrodes 130 and 136 are formed as layers and viewed along a direction normal to them.

Figure 2B:
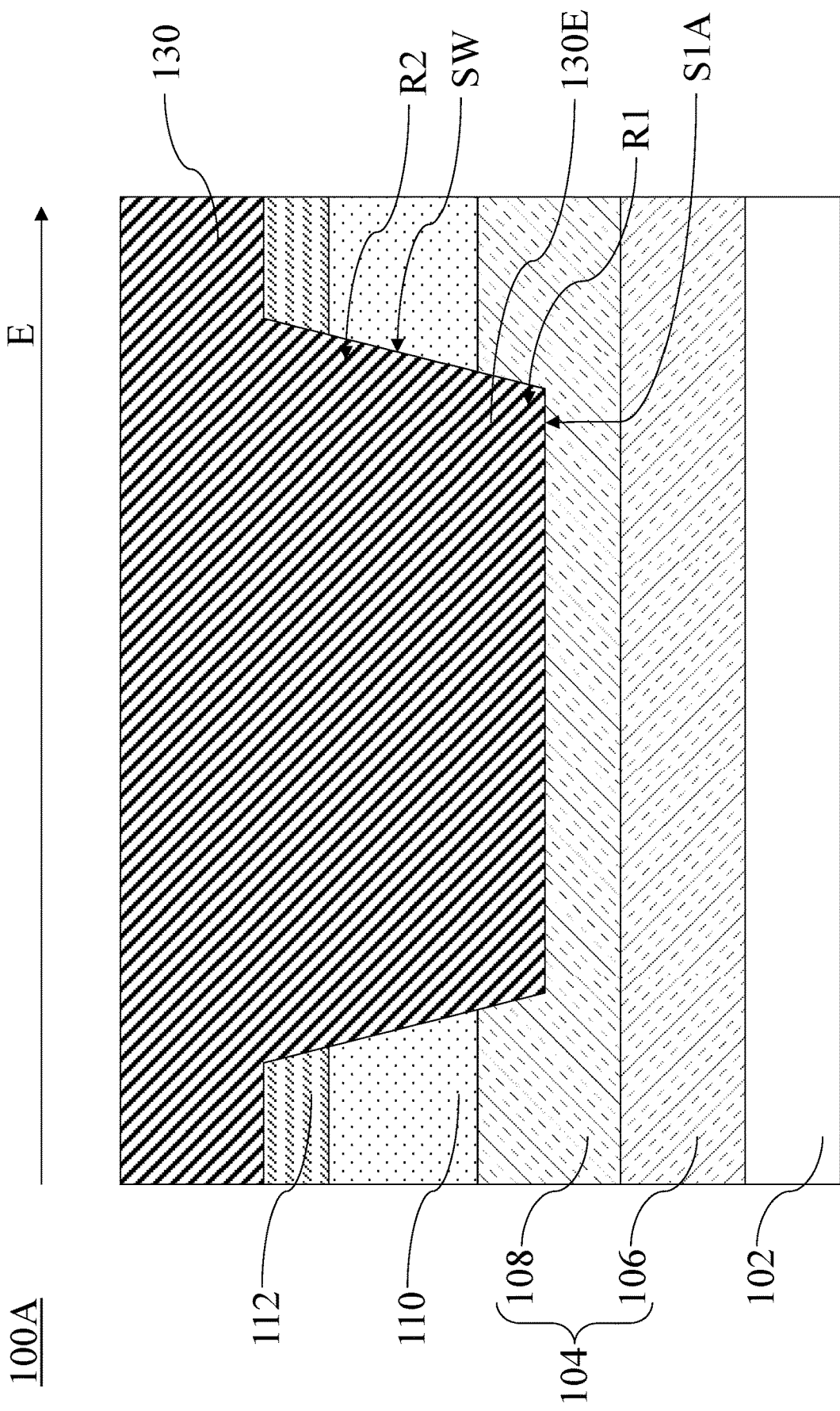
FIG. 2B is a cross-sectional view across a line 2B-2B' in FIG. 1.

To illustrate, FIGS. 2A and 2B are cross-sectional views across lines 2A-2A' and 2B-2B' of the semiconductor device 100A in FIG. 1. As shown in FIG. 2A, the semiconductor device 100A further includes a substrate 102, a buffer 104, nitride-based semiconductor layers 110 and 112, and a passivation layer 126.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer 104 is disposed over the substrate 102. The buffer 104 is configured to reduce lattice and thermal mismatches between the underlying layer and a layer to be formed on the buffer 104 (e.g. epitaxially formed thereon), thereby curing defects due to the mismatches/difference. The buffer 104 may include a III-V compound. The III-V compound can include, for example but are not limited to, aluminum, gallium, indium, nitrogen, or combinations thereof. Accordingly, the exemplary materials of the buffer 104 can further include, for example but are not limited to, GaN, AlN, AlGaN, InAlGaN, or combinations thereof.

The buffer 104 may be a buffer structure including more than one layer. For example, the buffer 104 may include a bottom portion 106 and a top-most portion 108. The top-most portion 108 is stacked/formed on the bottom portion 106. A distinguishable interface may exist between the bottom portion 106 and the top-most portion 108. In some embodiments, the bottom portion 106 and the top-most portion 108 are merged such that the interface therebetween is not distinguishable or is blurred.

The top-most portion 108 may include at least one layer. The bottom portion 106 may include at least one layer. The layer at the top-most portion 108 may have a compound different than that at the bottom portion 106. The layer at the bottom portion 106 may have a group III element, and the layer at the top-most portion 108 may be devoid of such group III element. For example, the layer at the bottom portion 106 may include aluminum, and the layer at the top-most portion 108 is devoid of aluminum. The layer at the top-most portion 108 may be a acceptor-doped nitride-based semiconductor compound. At least one dopant of the acceptor-doped nitride-based semiconductor compound is selected from one or more of carbon, silicon, germanium, iron, or tin. The layer at the top-most portion 108 may be a p-type nitride-based semiconductor compound. The layer at the bottom portion 106 may be a undoped nitride-based semiconductor compound. In some embodiments, the top-most portion 108 may include at least one layer of carbon-doped gallium nitride, and the bottom portion 106 may include at least one layer of undoped aluminum gallium nitride. In some embodiments, the top-most portion 108 may include at least one layer of iron-doped gallium nitride.

In some embodiments, the semiconductor device 100A may further include a nucleation layer (not illustrated). The nucleation layer may be formed between the substrate 102 and the buffer 104. The nucleation layer is configured to provide a top surface for growth of III-nitride material thereon, thereby providing a transition to accommodate a mismatch/difference between the semiconductor substrate 102 and a III-nitride layer to be formed on the top surface thereof (e.g. the buffer 104 epitaxially formed thereon). The exemplary material of the nucleation layer can include, for example but is not limited to AlN or any of its alloys.

The nitride-based semiconductor layer 110 is disposed over the buffer 104. The exemplary materials of the nitride-based semiconductor layer 110 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1. The nitride-based semiconductor layer 112 is disposed on the nitride-based semiconductor layer 110. The exemplary materials of the nitride-based semiconductor layer 112 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 110 and 112 are selected such that the nitride-based semiconductor layer 112 has a bandgap (i.e. forbidden band width) greater than a bandgap of the nitride-based semiconductor layer 110, which causes electron affinities thereof different from each other and forms a heterojunction therebetween. For example, when the nitride-based semiconductor layer 110 is an undoped GaN layer having bandgap of approximately 3.4 eV, the nitride-based semiconductor layer 112 may be an AlGaN layer having bandgap of approximately 4.0 eV. As such, the nitride-based semiconductor layers 110 and 112 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region 114 adjacent to the heterojunction. Accordingly, the semiconductor device 100A can include at least one GaN-based high-electron-mobility transistor (HEMT).

A gate structure 120 is disposed on/over/above the nitride-based semiconductor layer 112. The gate structure 120 includes a p-type doped III-V compound semiconductor layer 122 and a conductive gate 124. The conductive gate 124 can serve as a gate electrode. The p-type doped III-V compound semiconductor layer 122 and the conductive gate 124 are stacked on the nitride-based semiconductor layer 112. The p-type doped III-V compound semiconductor layer 122 is between the nitride-based semiconductor layer 112 and the conductive gate 124. In some embodiments, the gate structure 120 may further include a dielectric layer (not illustrated) between the nitride-based semiconductor layer 112 and the p-type doped III-V compound layer 122. In some embodiments, the gate structure 120 may further include a dielectric layer (not illustrated) between the p-type doped III-V compound layer 122 and the conductive gate 124.

The semiconductor device 100A is an enhancement mode device, which is in a normally-off state when the conductive gate 124 is at approximately zero bias. Specifically, the p-type doped III-V compound layer 122 may create a p-n junction with the nitride-based semiconductor layer 112 to deplete the 2DEG region 114, such that a zone of the 2DEG region 114 corresponding to a position below the gate structure 120 has different characteristics (e.g. different electron concentrations) than the rest of the 2DEG region 114 and thus is blocked. Due to such mechanism, the semiconductor device 100A has a normally-off characteristic. In other words, when no voltage is applied to the conductive gate 124 or a voltage applied to the conductive gate 124 is less than a threshold voltage (i.e. a minimum voltage required to form an inversion layer below the gate structure 120), the zone of the 2DEG region 114 below the gate structure 120 is kept blocked, and thus no current flows therethrough. Moreover, by providing the p-type doped III-V compound layer 122, gate leakage current is reduced and an increase in the threshold voltage during the off-state is achieved.

Furthermore, in order to improve the switching sensitivity of the enhancement-mode semiconductor device 100A, the layer at the top-most portion 108 of the buffer 104 may be formed as an acceptor-doped nitride-based semiconductor compound or a p-type nitride-based semiconductor compound. For example, the layer at the top-most portion 108 of the buffer 104 may be formed as a layer of a carbon-doped gallium nitride compound. In addition, the layer of the carbon-doped gallium nitride compound at the top-most portion 108 of the buffer 104 can increase a breakdown voltage of the semiconductor device 100A. Herein, "the layer of the carbon-doped gallium nitride compound at the top-most portion 108 of the buffer 104" means that the nitride-based semiconductor layer 110 would form an interface with the layer of the carbon-doped gallium nitride compound.

In some embodiments, the p-type doped III-V compound layer 122 can be omitted, such that the semiconductor device 100A is a depletion-mode device, which means the semiconductor device 100A in a normally-on state at zero gate-source voltage.

The exemplary materials of the p-type doped III-V compound layer 122 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg. In some embodiments, the nitride-based semiconductor layer 110 includes undoped GaN and the nitride-based semiconductor layer 112 includes AlGaN, and the p-type doped III-V compound layer 122 is a p-type GaN layer which can bend the underlying band structure upwards and to deplete the corresponding zone of the 2DEG region 114, so as to place the semiconductor device 100A into an off-state condition. In some embodiments, the conductive gate 124 may include metals or metal compounds. The conductive gate 124 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the conductive gate 124 may include, for example but are not limited to, nitrides, oxides, silicides, doped semiconductors, or combinations thereof. In some embodiments, an optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

The passivation layer 126 is disposed over the nitride-based semiconductor layer 112. The passivation layer 126 can be formed for a protection purpose or for enhancing the electrical properties of the device. The passivation layer 126 covers a top surface of the nitride-based semiconductor layer 112. The passivation layer 126 may cover at least one sidewall of the gate structure 126. For example, the passivation layer 126 can cover opposite two sidewalls of the gate structure 126. The exemplary materials of the passivation layer 126 can include, for example but are not limited to, $SiN_x$, $SiO_x$, SiON, SiC, SiBN, SiCBN, oxides, nitrides, or combinations thereof. In some embodiments, the passivation layer 126 is a multi-layered structure, such as a composite dielectric layer of $Al_2O_3$/SiN, $Al_2O_3$/$SiO_2$, AlN/SiN, AlN/$SiO_2$, or combinations thereof.

The S/D electrodes 130 and 136 are disposed on the nitride-based semiconductor layer 112. The S/D electrodes 130 and 136 are typically located at two opposite sides of the passivation layer 126 although other configurations may be used, particularly when plural source, drain, or gate electrodes are employed in the device. Sidewalls of the S/D electrodes 130 and 136 may be in contact with the passivation layer 126. The S/D electrodes 130 and 136 are located at two opposite sides of the gate structure 120. The gate structure 120 and the S/D electrodes 130 and 136 can collectively act as a GaN-based HEMT with the 2DEG region 114.

Figure 3:
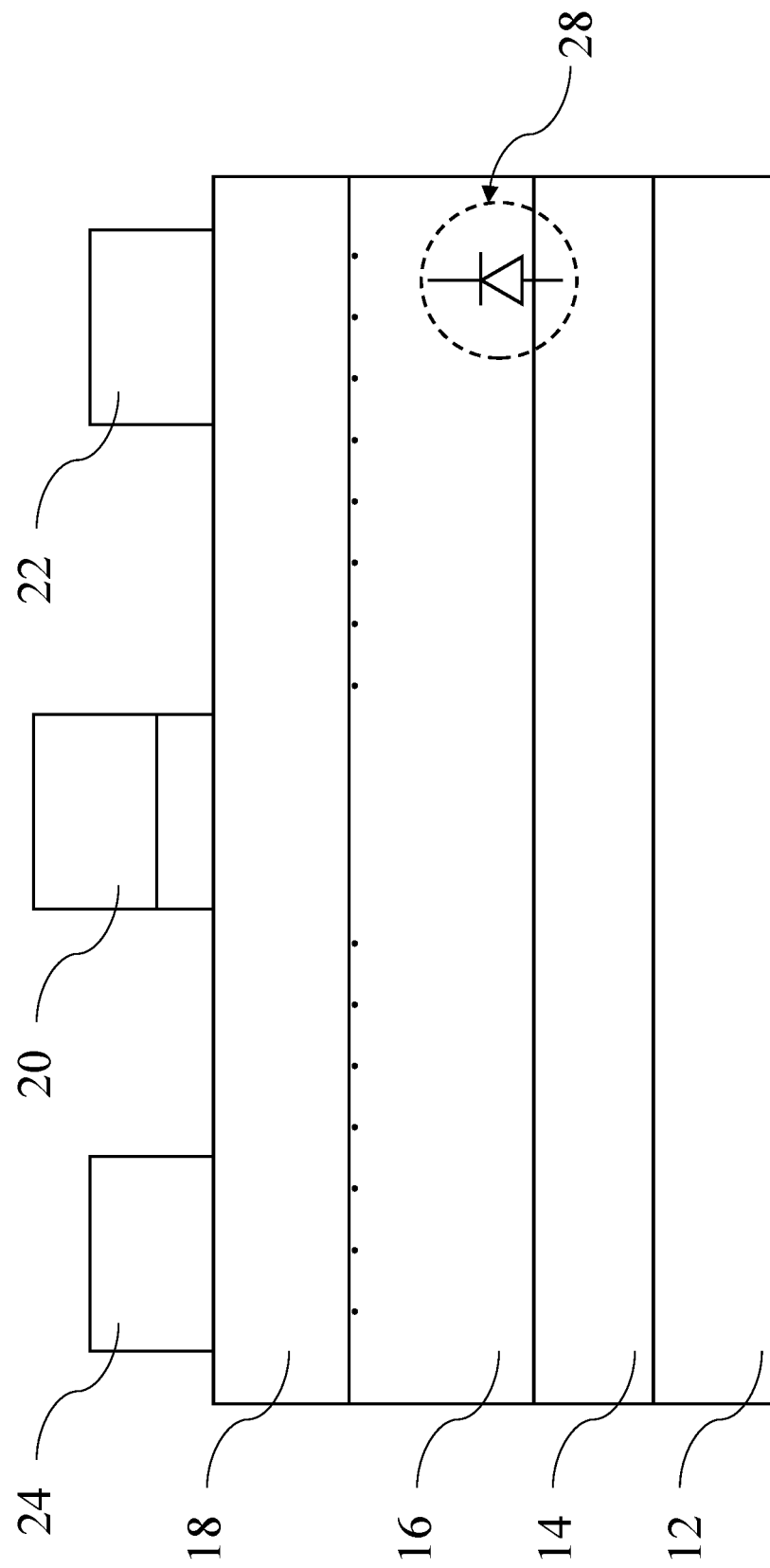
FIG. 3 is a cross-sectional view schematically showing a semiconductor device according to a comparative embodiment.

The S/D electrode 130 has a profile that extends downward to reach the top-most portion 108 of the buffer, which is made for improving an dynamic on-resistance (Ron) peak issue. To demonstrate how the dynamic Ron peak issue occurs, FIG. 3 is a cross-sectional view schematically showing a semiconductor device 10 according to a comparative embodiment. The semiconductor device 10 includes a substrate 12, a buffer 14, nitride-based semiconductor layer 16 and 18, a gate structure 20, and a pair of S/D electrodes 22 and 24, in which a 2DEG region is formed at an interface between the nitride-based semiconductor layers 16 and 18. Once the buffer 14 includes an acceptor-doped nitride-based semiconductor compound, which has some p-type properties, a parasitic p-n junction diode 28 would be formed across the buffer 14 and the nitride-based semiconductor layer 16. During operation of the semiconductor device 10, the parasitic p-n junction diode 28 will affect the concentration of the 2DEG region, impacting the dynamic Ron and dynamic threshold voltage (Vth).

More specifically, the operation of the semiconductor device 10 can be divided into a low-voltage interval (e.g. below about 100V) and a high-voltage interval (e.g. over about 100V). In the low-voltage interval, a drain-source bias (Vds) increases, such that the parasitic p-n junction diode 28 is reverse biased and thus the 2DEG region is depleted. When the Vds further increases, the depleting effect in the 2DEG region gradually rises. As such, the Ron continues to increase as the Vds increases. In the high-voltage interval, when the Vds increases to a certain value, a leakage in the parasitic p-n junction diode 28 occurs; charges at a p-n junction of the parasitic p-n junction diode 28 disappear; and the depleted 2DEG region gradually recovers. Accordingly, the Ron gradually decreases. That is, the Ron depending on the Vds will be greatly affected by the parasitic p-n junction diode 28, and there is a Ron peak between the low-voltage and the high-voltage intervals, which is referred as to the dynamic Ron peak issue; this occurs at approximately 100V.

Further, the performance of the semiconductor device 10 depends on the Ron. For example, the stability of the Ron can affect working efficiency, working frequency, and working temperature of the semiconductor device. Accordingly, for semiconductor device design, the dynamic Ron serves as an important factor. This factor may dominate the semiconductor device size, which leads to increased costs. Also, this factor may have a correlation with the semiconductor device temperature. Once the semiconductor device temperature rises, the semiconductor device may burn out or otherwise fail. The dynamic Ron peak issue is a difficult problem that requires improvement in the field of HEMT devices.

Referring to FIG. 2A again, the S/D electrode 130 has a profile different from the profile of the S/D electrode 136. The profiles of the first and second electrodes are asymmetric with respect to the gate structure 120. This "profile" can include several characters/properties/features, as described below.

For example, with respect to the gate structure 120, the S/D electrode 130 has a shape different than that of the S/D electrode 136. In the exemplary illustration of FIG. 2A (i.e. in the cross-sectional view), the shape of the S/D electrode 130 is approximately L-shaped, and the shape of the S/D electrode 136 is approximately rectangular.

With respect to the gate structure 120, the S/D electrode 130 has a distance difference greater than that of the S/D electrode 136. In the exemplary illustration of FIG. 2A, a vertical distance from a bottom surface of the S/D electrode 130 to a bottom surface of the gate structure 120 is greater than a vertical distance from a bottom surface of the S/D electrode 136 to the bottom surface of the gate structure 120. That is, with respect to the gate structure 120, the bottom surface of the S/D electrode 130 is deeper than the bottom surface of the S/D electrode 136. Moreover, with respect to the gate structure 120, the bottom surface of the S/D electrode 130 is deeper than the top-most surface of the top-most portion 108 of the buffer 104. As such, the S/D electrode 130 is closer to the top-most portion 108 of the buffer 104 than the S/D electrode 136.

The S/D electrodes 130 and 136 can be regarded as two conductive electrodes extending downward. A top surface of the passivation layer 126 can be taken as an extending reference plane/level. The downward-extending length of the S/D electrode 130 is greater than the downward-extending length of the S/D electrode 136. The S/D electrode 130 extends downward to a position lower than the nitride-based semiconductor layer 110. The S/D electrode 136 extends downward to a position higher than the nitride-based semiconductor layer 110. The S/D electrode 130 extends downward to a position within a thickness of the top-most portion 108 of the buffer 104. The S/D electrode 136 extends downward to a position within a thickness of the second nitride-based semiconductor layer 112.

The S/D electrodes 130 and 136 extend downward such that the S/D electrode 130 has a bottom-most surface in a position lower than the first S/D electrode 136. The bottom-most surface of the S/D electrode 130 is in a position lower than an entirety of the S/D electrode 136. The S/D electrodes 130 and 136 extend downward such that the S/D electrode 136 has a bottom-most surface in a position higher than the first S/D electrode 130. The bottom-most surface of the S/D electrode 136 is in a position higher than at least one portion of the S/D electrode 130. Since the S/D electrode 130 extends downward in a certain degree, the S/D electrode 130 can have a longitudinal length greater than a lateral length thereof. The longitudinal length is along a direction normal to the nitride-based semiconductor layer 110 or 112, which is along a vertical direction in FIG. 2A. The lateral length is orthogonal to the longitudinal length and is along a horizontal direction in FIG. 2A. Furthermore, the lateral length of the S/D electrode 130 is greater than a lateral length of the S/D electrode 136. That is, the S/D electrodes 130 and 136 may have different widths. The S/D electrode 130 may have a width greater than that of the S/D electrode 136.

The downward extending of the S/D electrode 130 can electrically connect the S/D electrode 130 to the buffer 104. The S/D electrode 130 can form at least one interface with the top-most portion 108 of the buffer 104. The S/D electrode 130 can make contact with the at least one layer of the p-type nitride-based semiconductor compound in the top-most portion 108 of the buffer 104. The S/D electrode 130 can make contact with the at least one layer of the acceptor-doped nitride-based semiconductor compound in the top-most portion 108 of the buffer 104. More specifically, the S/D electrode 130 extends downward to pass through or penetrate the nitride-based semiconductor layers 110 and 112 and stops within at a thickness of the buffer 104. The S/D electrode 130 may stops within at a thickness of the top-most portion 108 of the buffer 104.

Explained in a different way, the S/D electrode 130 is disposed over and in contact with the top-most portion 108 of the buffer 104 and extends upward from a position lower than the 2DEG region 114 to a position higher the 2DEG region 114 and to a position higher than the nitride-based semiconductor layers 110 and 112. As such, the S/D electrode 130 can have a side surface near or in contact with the 2DEG region 114. In addition, the S/D electrode 130 can extend upward from a position higher than the distinguishable interface between the bottom portion 106 and the top-most portion 108 of the buffer 104.

Since the S/D electrode 130 is in contact with the layer of the top-most portion 108 of the buffer 104, the S/D electrode 130 is electrically coupled with the p-type/acceptor-doped compound in the top-most portion 108 of the buffer 104. Accordingly, the S/D electrode 130 and the p-type/acceptor-doped compound in the top-most portion 108 of the buffer 104 can have the same electric potential, or have different electric potentials approaching each other. The electric potential difference between the S/D electrode 130 and the top-most portion 108 of the buffer 104 is less than the electric potential difference between the S/D electrode 136 and the top-most portion 108 of the buffer 104. As such, the parasitic p-n junction diode is prevented from being reverse biased, and thus the formation of the dynamic Ron peak is suppressed/avoided to improve the problems discussed above with respect to FIG. 3. Correspondingly, the reliability and the performance of the semiconductor device 100A are improved.

In the exemplary illustration of FIG. 2A, the S/D electrode 130 has portions 132 and 134. The portions 132 and 134 of the S/D electrode 130 are connected with each other, which means they are formed by patterning a single blanket layer. The portion 134 of the S/D electrode 130 is located between the S/D electrode 136 and the portion 132 of the S/D electrode 130. The portion 132 has a bottom-most surface S1A in a position lower than a bottom-most surface S1B of the portion 134. The S/D electrode 130 has a corner profile between the portions 132 and 134. The bottom-most surface S1A of the portion 132 forms an interface with the top-most portion 108 of the buffer 104. The manufacturing process for the S/D electrode 130 with such profile is straightforward, resulting in a good yield rate.

The portion 132 of the S/D electrode 130 further has a side surface forming at least one interface with the top-most portion 108 of the buffer 104, which increasing a contact area between the S/D electrode 130 and the top-most portion 108 of the buffer 104. The side surface and the bottom-most surface S1A of the portion 132 of the S/D electrode 130 may share the same edge. For example, the side surface and the bottom-most surface S1A of the portion 132 of the S/D electrode 130 are vertical and horizontal, respectively, and they coincide at the same edge. The side surface of the portion 132 of the S/D electrode 130 also can form interfaces with the nitride-based semiconductor layers 110 and 112.

In the exemplary illustration of FIG. 2A, the right and left S/D electrodes 130 and 136 can serve as drain and source electrodes, respectively. The S/D electrodes 130 and 136 may be optionally asymmetrical about the gate structure 120. In some embodiments, the S/D electrode 130 is closer to the gate structure 120 than the S/D electrode 136. In other embodiments, the S/D electrode 136 is closer to the gate structure 120 than the S/D electrode 130.

In some embodiments, the S/D electrodes 130 and 136 can include, for example but are not limited to, metals, alloys, doped semiconductor materials (such as doped crystalline silicon), compounds such as silicides and nitrides, other conductor materials, or combinations thereof. The exemplary materials of the S/D electrodes 130 and 136 can include, for example but are not limited to, Ti, AlSi, TiN, or combinations thereof. The S/D electrodes 130 and 136 may be a single layer, or plural layers of the same or different composition. In some embodiments, the S/D electrodes 130 forms ohmic contact with the top-most portion 108 of the buffer 104. In some embodiments, the S/D electrode 136 forms ohmic contact with the nitride-based semiconductor layer 112. The ohmic contact can be achieved by applying Ti, Al, or other suitable materials to the S/D electrodes 130 and 136.

FIG. 2B is a cross-sectional view across a line 2B-2B' in FIG. 1, which is along the extending direction E in FIG. 1. The top-most portion 108 of the buffer 104 has at least one recess R1. The recess R1 of the buffer 104 can receive the S/D electrode 130. The S/D electrode 130 further has at least one downward extending portion 130E in the recess R1. An end of the downward extending portion 130E is enclosed by the top-most portion 108 of the buffer 104. The recess R1 enclosing the downward extending portion 130E has a gradual narrow boundary. In other embodiments, the recess R1 enclosing the downward extending portion 130E has a vertical boundary.

In addition to the recess R1, the nitride-based semiconductor layers 110 and 112 can collectively have at least one recess R2 with the top-most portion 108 of the buffer 104, so as to receive the S/D electrode 130. The entirety of the downward extending portion 130E fills into the recess R2. The recess R2 has at least one sidewall SW collectively defined by the nitride-based semiconductor layers 110 and 112 and the top-most portion 108 of the buffer 104. The sidewall SW encloses/surrounds the downward extending portion 130E. The sidewall SW forms an obtuse angle with respect to the interface between the top-most portion 108 of the buffer 104 and the downward extending portion 130E.

To achieve such profile of the S/D electrode 130, no complex manufacturing process needs to be introduced, and thus a yield rate of a manufacturing process for the semiconductor device 100A would not be affected. That is, there is no need to sacrifice the yield rate in order to achieve this profile of the S/D electrode 130. Different stages of a method for manufacturing the semiconductor device 100A are shown in FIGS. 4A-4D, described below.

Referring to FIG. 4A, a substrate 102 is provided. A buffer 104 and nitride-based semiconductor layers 110 and 112 are formed above the substrate 102 in sequence. The buffer 104 includes a bottom portion 106 and a top-most portion 108 which can be formed above the substrate 102 in sequence by using deposition techniques. The nitride-based semiconductor layers 110 and 112 can be formed above the substrate 102 in sequence by using deposition techniques. The deposition techniques can include, for example but are not limited to, atomic layer deposition (ALD), physical vapor deposition (PVD), chemical vapor deposition (CVD), metal organic CVD (MOCVD), plasma-assisted vapor deposition, epitaxial growth, or other suitable processes.

Figure 4B:
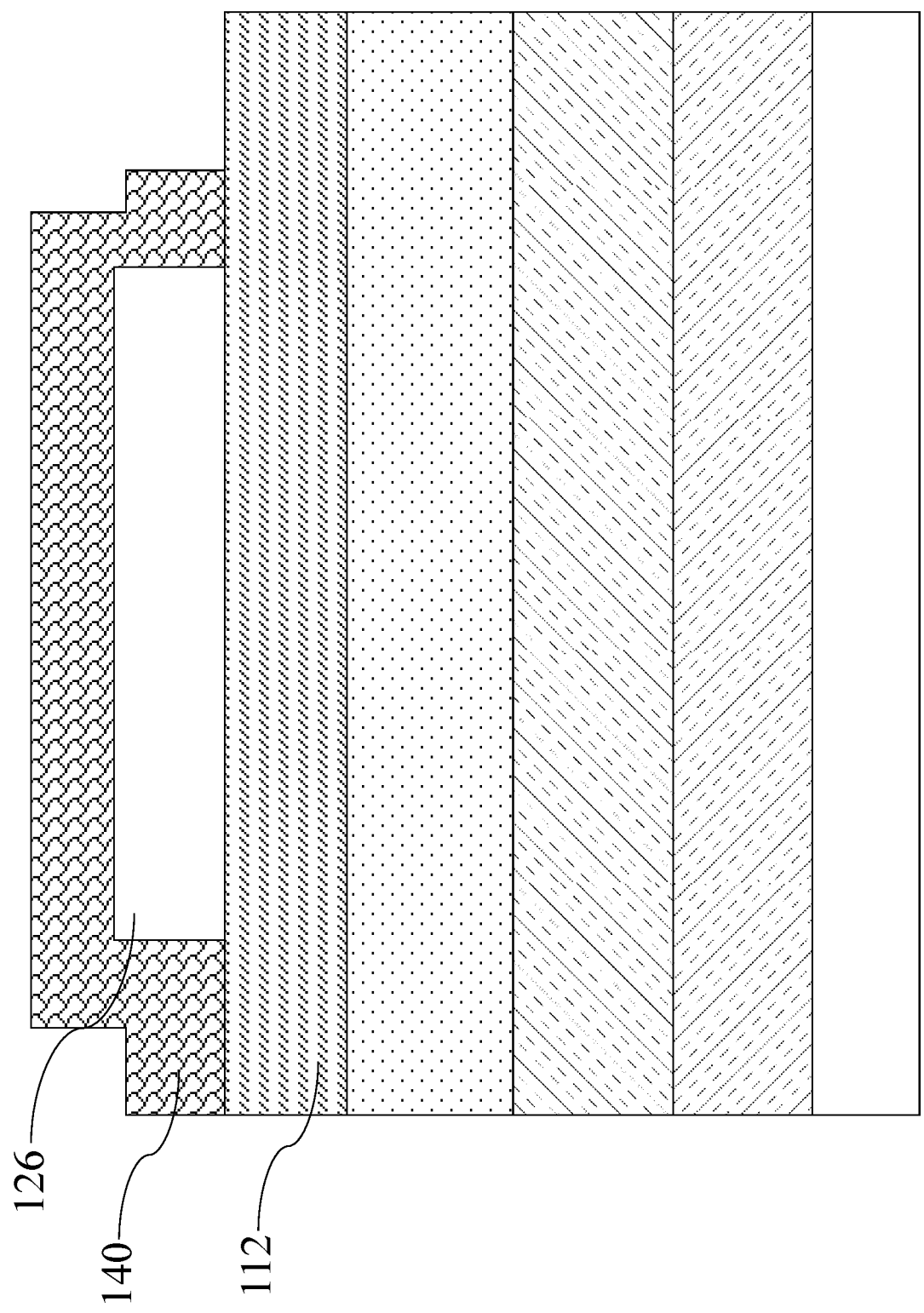

Referring to FIG. 4B, a passivation layer 126 is formed to cover the nitride-based semiconductor layer 112. A protection layer 140 is formed to cover the passivation layer 126. The protection layer 140 can serve as a mask layer in a removing process, such as etching process. The protection layer 140 is conformal with the passivation layer 126. The protection layer 140 further covers two opposite sidewalls of the passivation layer 126. At least one region of the nitride-based semiconductor layer 112 is exposed from the protection layer 140. The formation of each of the passivation layer 126 and the protection layer 140 can be achieved by using deposition techniques. The deposition techniques can include, for example but are not limited to, ALD, PVD, CVD, MOCVD, epitaxial growth, or other suitable processes.

Figure 4C:
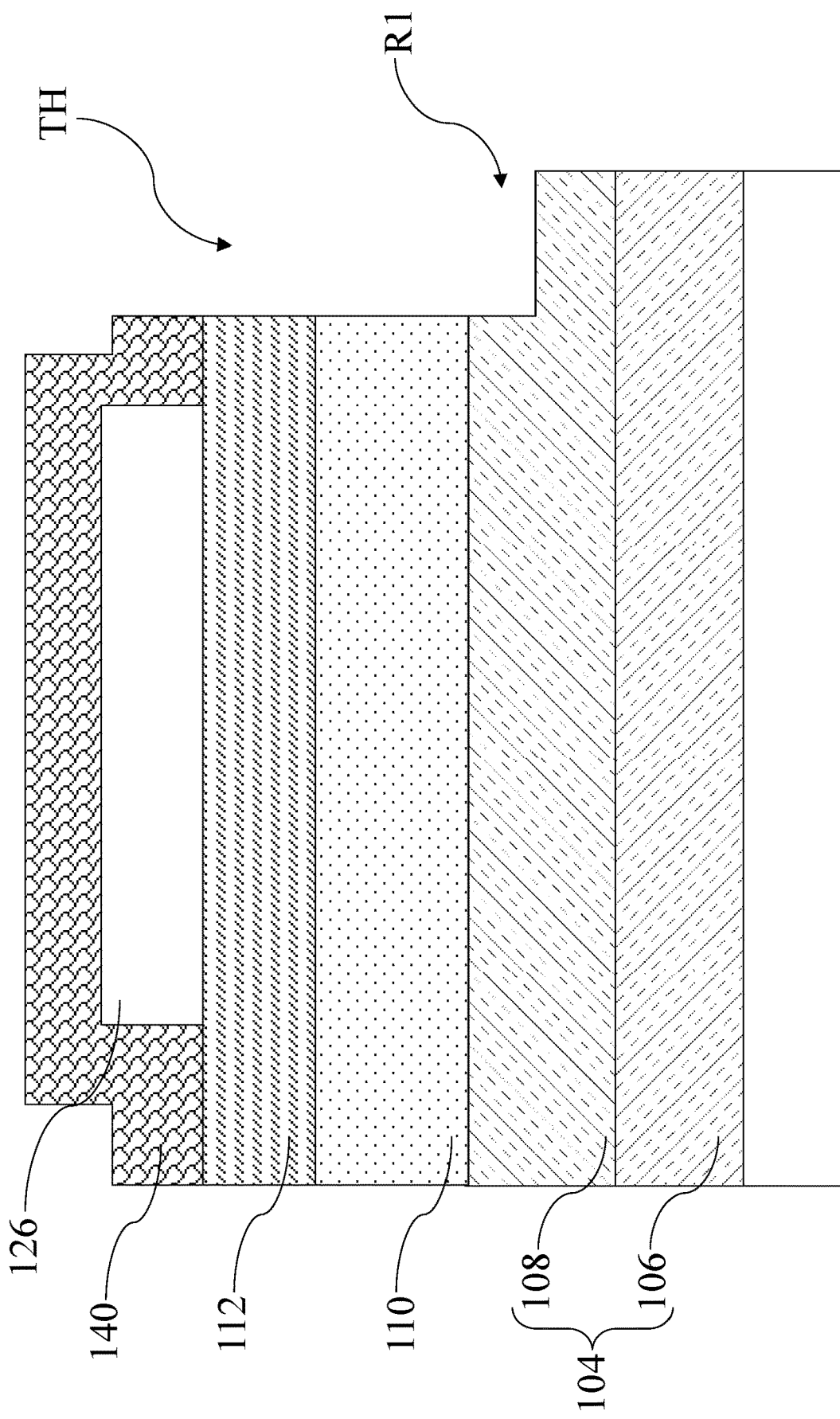

Referring to FIG. 4C, a through hole TH is formed in the nitride-based semiconductor layers 110 and 112. A portion of the nitride-based semiconductor layer 110 and a portion of the nitride-based semiconductor layer 112 are removed to form the through hole TH. A portion of the top-most portion 108 of the buffer 104 is further removed. The removal of the portion of the top-most portion 108 of the buffer 104 is performed such that a recess R1 is formed under the through hole TH. The recess R1 and the through hole TH can be referred as to a deep recess. The locations of the through hole TH and the recess R1 correspond to the region of the nitride-based semiconductor layer 112 exposed from the protection layer 140, as illustrated in FIG. 4B. The removing can be performed by, for example but is not limited to, etching technique (an etching process such as dry etching or wet etching), laser technique (laser drill or laser cutting) or other suitable technique.

Figure 4D:
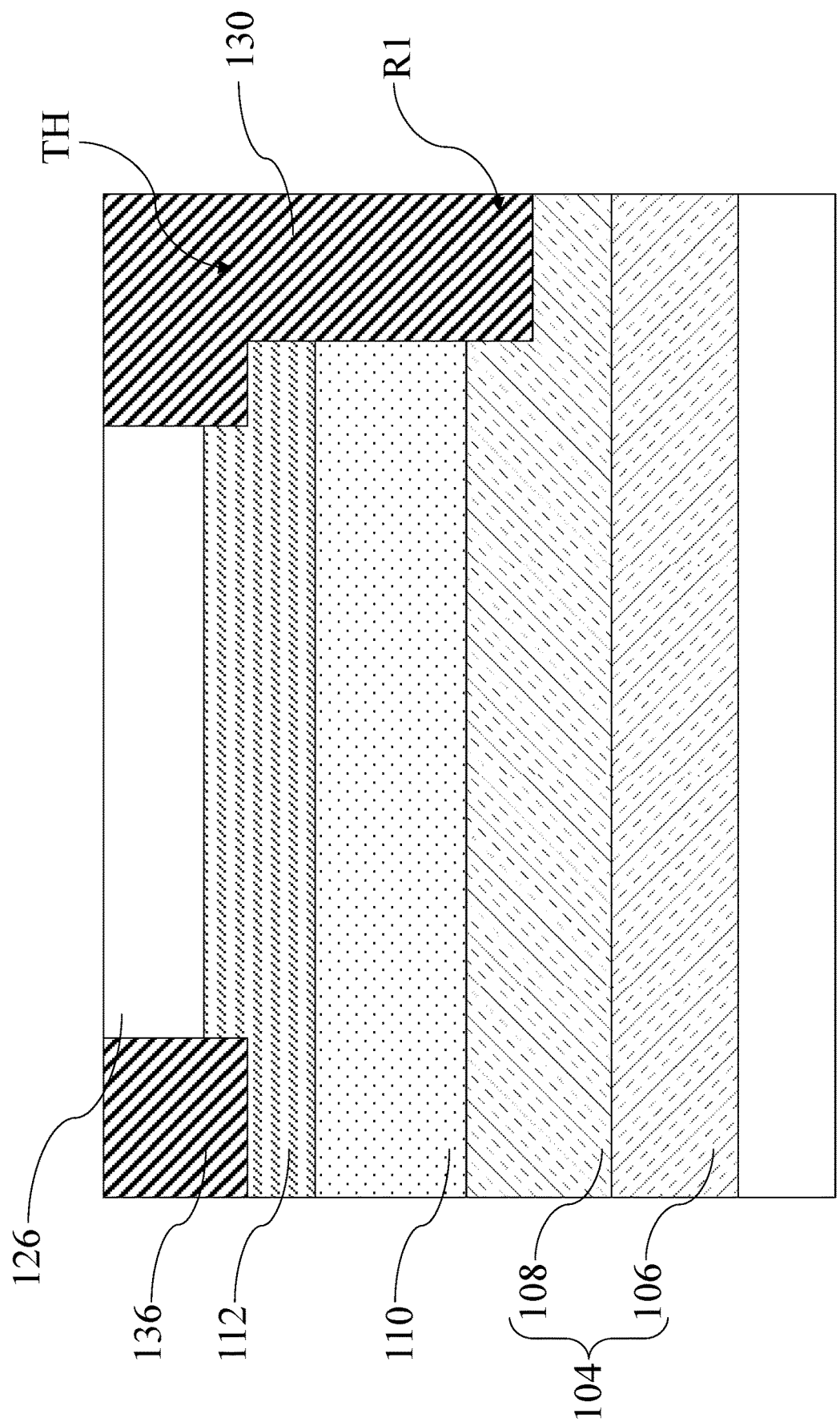

Referring to FIG. 4D, the protection layer 140 is removed, and S/D electrodes 130 and 136 are formed. The S/D electrode 130 is formed in the through hole TH and the recess R1. The S/D electrode 130 forms an interface with the exposed top-most portion 108 of the buffer 104 (i.e. exposed from the recess R1 as illustrated in FIG. 4C). Some portions of the S/D electrodes 130 and 136 are in a position lower than a top-most surface of the nitride-based semiconductor layer 112. In some embodiments, some portions of the nitride-based semiconductor layer 112 are removed to form recesses/trenches, which can receive bottoms of the S/D electrodes 130 and 136. In some embodiments, as the passivation layer 126 is formed, a patterning process can be performed on the passivation layer 126 to define S/D regions for the formation of the S/D electrodes 130 and 136. During the patterning process, some portions of the nitride-based semiconductor layer 112 are removed as well, such that recesses/trenches are formed at S/D regions for receiving bottoms of the S/D electrodes 130 and 136. In some embodiments, the formation of the S/D electrodes 130 and 136 includes deposition techniques and a series of lithographic processes. The deposition techniques can include, for example but are not limited to, ALD, PVD, CVD, MOCVD, epitaxial growth, or other suitable processes. The series of lithographic processes include applying a photoresist layer, etch, development, and/or other suitable processes, so as to pattern the formed S/D electrodes 130 and 136.

After the stage illustrated in FIG. 4D, a gate structure can be formed above the nitride-based semiconductor layers 110 and 112, so as to obtain the structure as afore-mentioned. In some embodiments, the gate structure can be formed in the passivation layer 126. That is, a recess/trench can be formed in the passivation layer 126, and the gate structure is formed to fill the recess/trench. In other embodiments, the gate structure can be formed over all or a portion of the passivation layer 126. The formation of the gate structure includes forming a p-type doped III-V compound layer and forming a conductive gate in sequence. The formation of the gate structure can be achieved by using deposition techniques and a series of lithographic processes. The deposition techniques can include, for example but are not limited to, ALD, PVD, CVD, MOCVD, epitaxial growth, or other suitable processes. The series of lithographic processes include applying a photoresist layer, etch, development, and/or other suitable processes.

Figure 5:
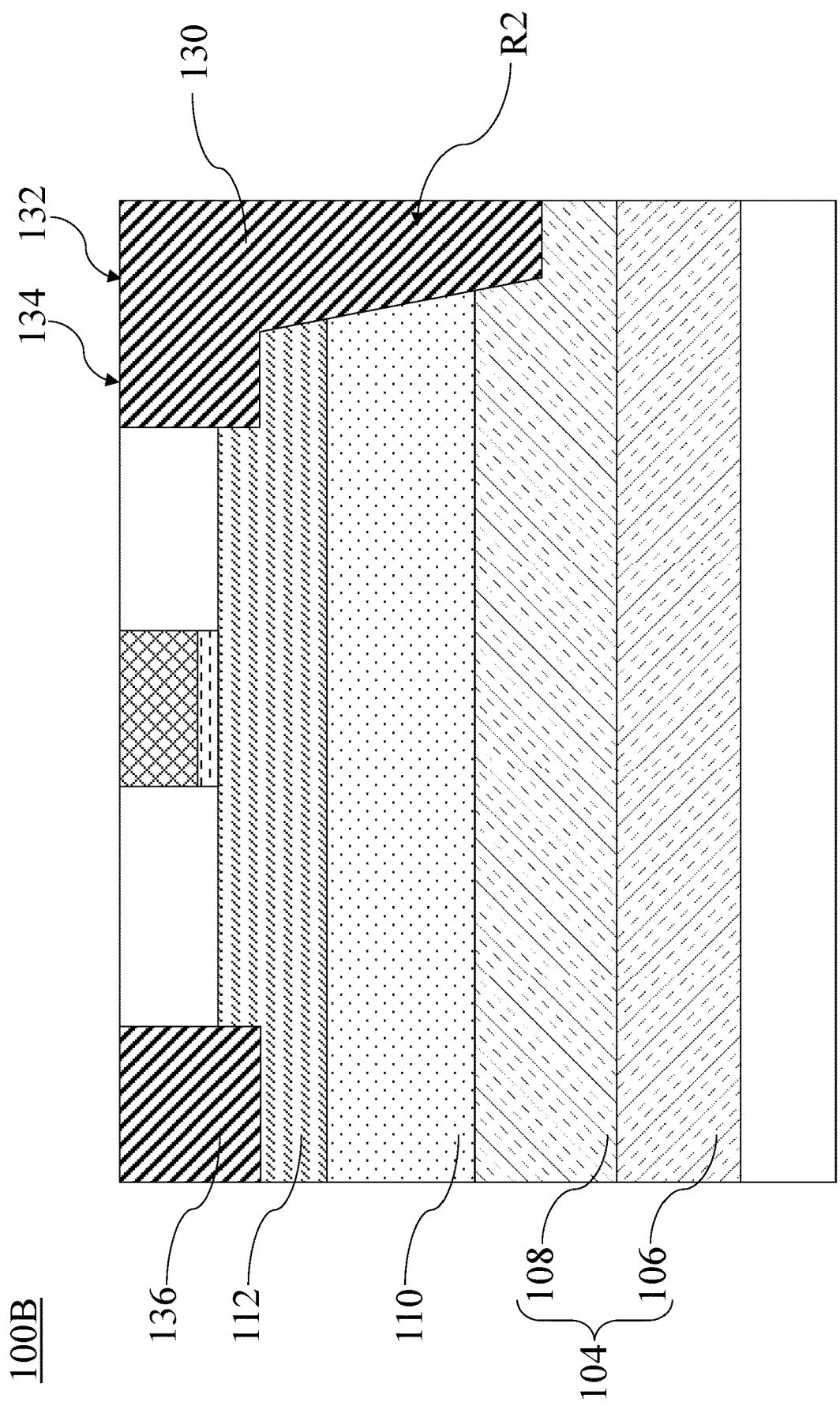
FIG. 5 is a cross-sectional view of a semiconductor device according to some embodiments of the present disclosure.

FIG. 5 is a cross-sectional view of a semiconductor device 100B according to some embodiments of the present disclosure. In the present embodiment, as shown in the exemplary illustration of FIG. 5, the portion 132 of the S/D electrode 130 is formed with a slanted sidewall (i.e. more slanted than that of the S/D electrode 136). More specifically, the recess R2 can have at least one sidewall that is defined by the nitride-based semiconductor layers 110 and 112 and the top-most portion 108 of the buffer 104. The sidewall of the recess R2 forms an obtuse angle with respect to the interface, which is between the portion 132 of the S/D electrode 130 and the top-most portion 108 of the buffer 104. Corresponding to the profile of the sidewall of the recess R2, the portion 132 of the S/D electrode 130 filling the recess R2 may have the slanted sidewall. A corner between the portions 132 and 134 of the S/D electrode 130 is an obtuse angle. Even though the sidewall of the recess R2 is slanted, the dynamic Ron peak issue can still be improved, which means the manufacturing process for a semiconductor device is flexible.

Figure 6B:
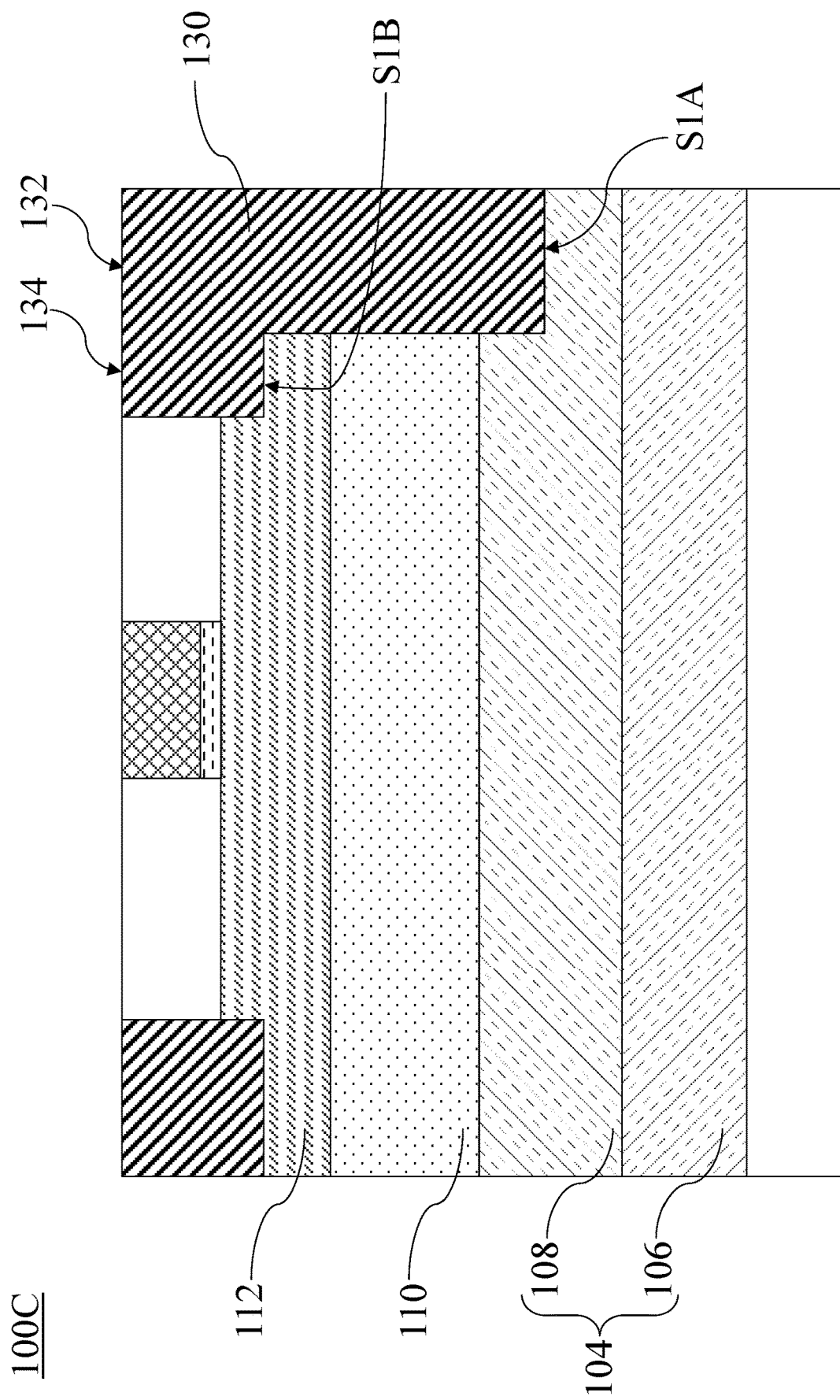
FIG. 6B is a cross-sectional view across a line 6B-6B' in FIG. 6A.
Figure 6C:
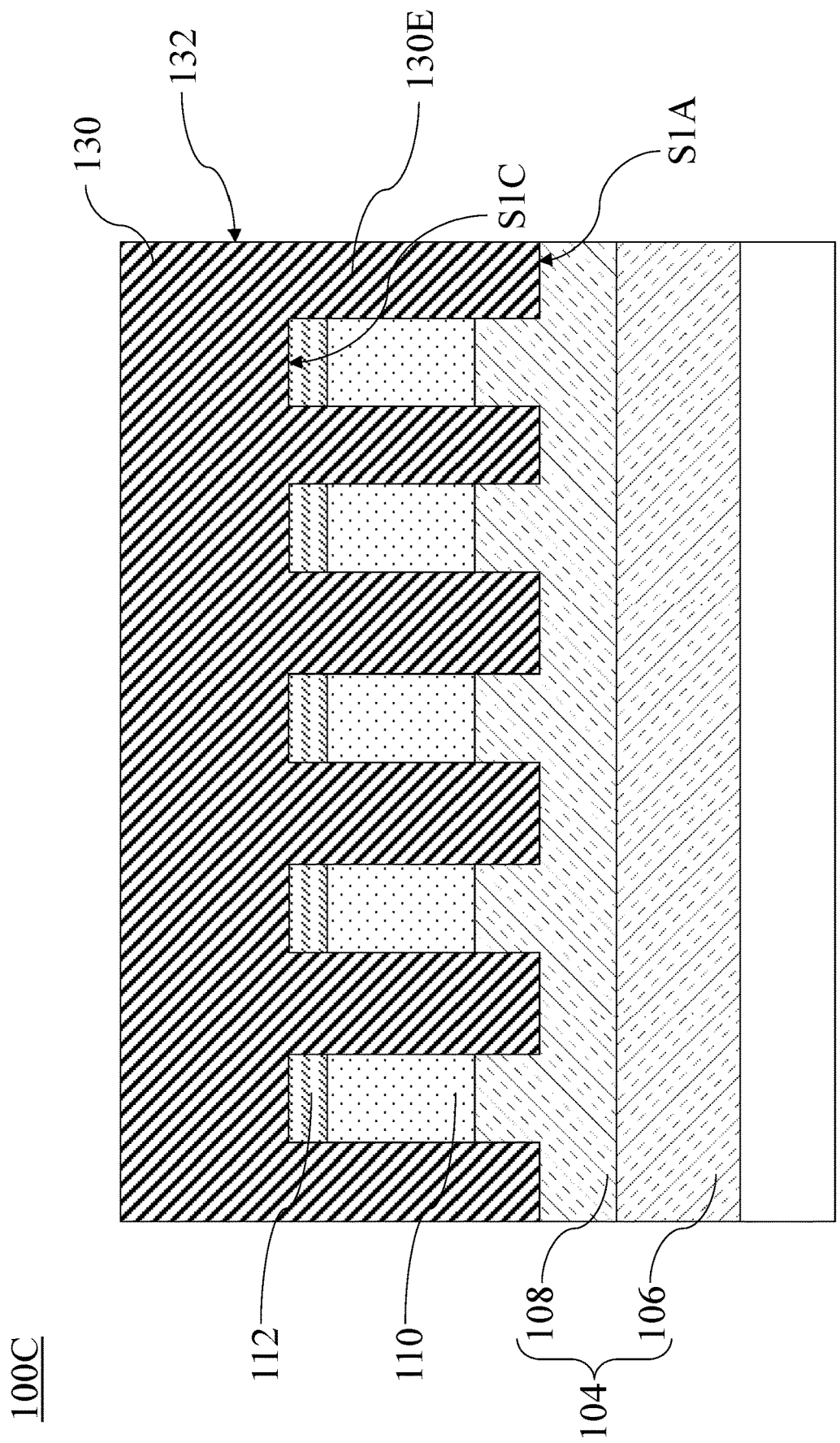
FIG. 6C is a cross-sectional view across a line 6C-6C' in FIG. 6A.

FIG. 6A is a top view of a semiconductor device according to some embodiments of the present disclosure, and FIGS. 6B and 6C are cross-sectional views across lines 6B-6B' and 6C-6C' in FIG. 6A. In the present embodiment, as shown in the exemplary illustration of FIG. 6B, the portion 132 of the S/D electrode 130 has the bottom surface S1A forming the interface with the top-most portion 108 of the buffer 104, and further has a bottom surface S1C that is higher than the bottom surface S1A. The bottom surface SiC forms at least one interface with the nitride-based semiconductor layer 112. The portion 134 has the bottom surface S1B forming the interface with the nitride-based semiconductor layer 112. The bottom surfaces S1B and SiC may be located at the same level height. The bottom surfaces S1B and SiC may be coplanar with each other. In the exemplary illustration of FIG. 6C, the portion 132 of the S/D electrode 130 has a plurality of the downward extending portions 130E in a plurality of the recesses R1. The plurality of the downward extending portions 130E respectively form interfaces with the top-most portion 108 of the buffer 104. The downward extending portions 130E are arranged along the extending direction E. The interfaces between the downward extending portions 130E and the top-most portion 108 of the buffer 104 are arranged along the extending direction E as well. At least one portion of the nitride-based semiconductor layer 112, at least one portion of the nitride-based semiconductor layer 110, and at least one portion of the top-most portion 108 of the buffer 104 is between two of the downward extending portions 130E. Even though the portion 132 of the S/D electrode 130 is formed with the plurality of the downward extending portions 130E, the dynamic Ron peak issue can still be improved, which means the manufacturing process for a semiconductor device is flexible.

Figure 7:
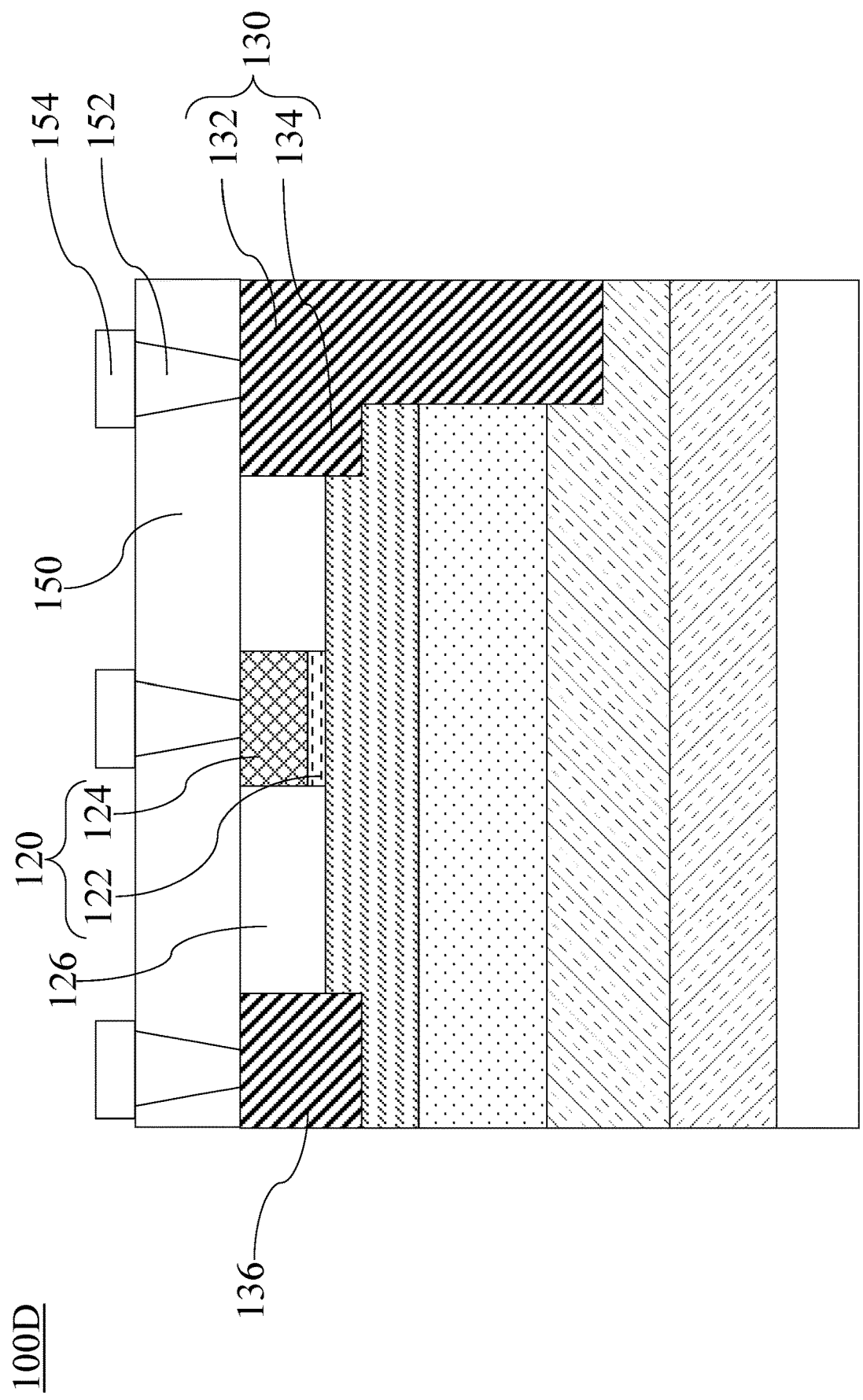
FIG. 7 is a cross-sectional view of a semiconductor device according to some embodiments of the present disclosure.

FIG. 7 is a cross-sectional view of a semiconductor device 100D according to some embodiments of the present disclosure. In the present embodiment, as shown in the exemplary illustration of FIG. 7, the semiconductor device 100D further includes additional layers disposed on the HEMT device. The semiconductor device 100D further includes a passivation layer 150, vias 152, and a patterned conductive layer 154.

The passivation layer 150 is disposed on the passivation layer 126. The passivation layer 150 covers the passivation layer 126, the gate structure 120, and the S/D electrodes 130 and 136. The exemplary materials of the passivation layer 150 can include, for example but are not limited to, $SiN_x$, $SiO_x$, SiON, SiC, SiBN, SiCBN, oxides, nitrides, or combinations thereof. In some embodiments, the passivation layer 150 is a multi-layered structure, such as a composite dielectric layer of $Al_2O_3$/SiN, $Al_2O_3$/$SiO_2$, AlN/SiN, AlN/$SiO_2$, or combinations thereof. In some embodiments, the passivation layer 150 can be formed by using deposition techniques. The deposition techniques can include, for example but are not limited to, ALD, PVD, CVD, MOCVD, epitaxial growth, or other suitable processes.

The vias 152 are disposed within the passivation layer 150. The vias 152 penetrate the passivation layer 150. The vias 152 extend longitudinally to electrically couple with the gate structure 120, the S/D electrodes 130 and 136, respectively. Tops of the vias 152 are free from coverage of the passivation layer 150. The exemplary materials of the vias 152 can include, for example but are not limited to, conductive materials, such as metals or alloys. The formation of the vias 152 includes forming a conductive layer within and over the passivation layer 150 and removing the excess portions of the conductive layer. In some embodiments, a planarization process is performed to remove the excess portions of the conductive layer. In some embodiments, the planarization process includes a chemical mechanical polish (CMP) process.

A patterned conductive layer 154 is disposed on the passivation layer 150 and the vias 152. The patterned conductive layer 154 is in contact with the vias 152. The formation of the patterned conductive layer 154 includes forming a blanket conductive layer on the passivation layer 150 by using deposition techniques. The deposition techniques can include, for example but are not limited to, ALD, PVD, CVD, MOCVD, epitaxial growth, or other suitable processes. A patterning process is performed on the blanket conductive layer to form the patterned conductive layer 154 including metal lines in contact with the vias 152, respectively. The patterning process can be performed by photolithography, exposure and development, etching, other suitable processes, or combinations thereof. In some embodiments, the patterned conductive layer 154 may serve as pads or traces.

Figure 8:
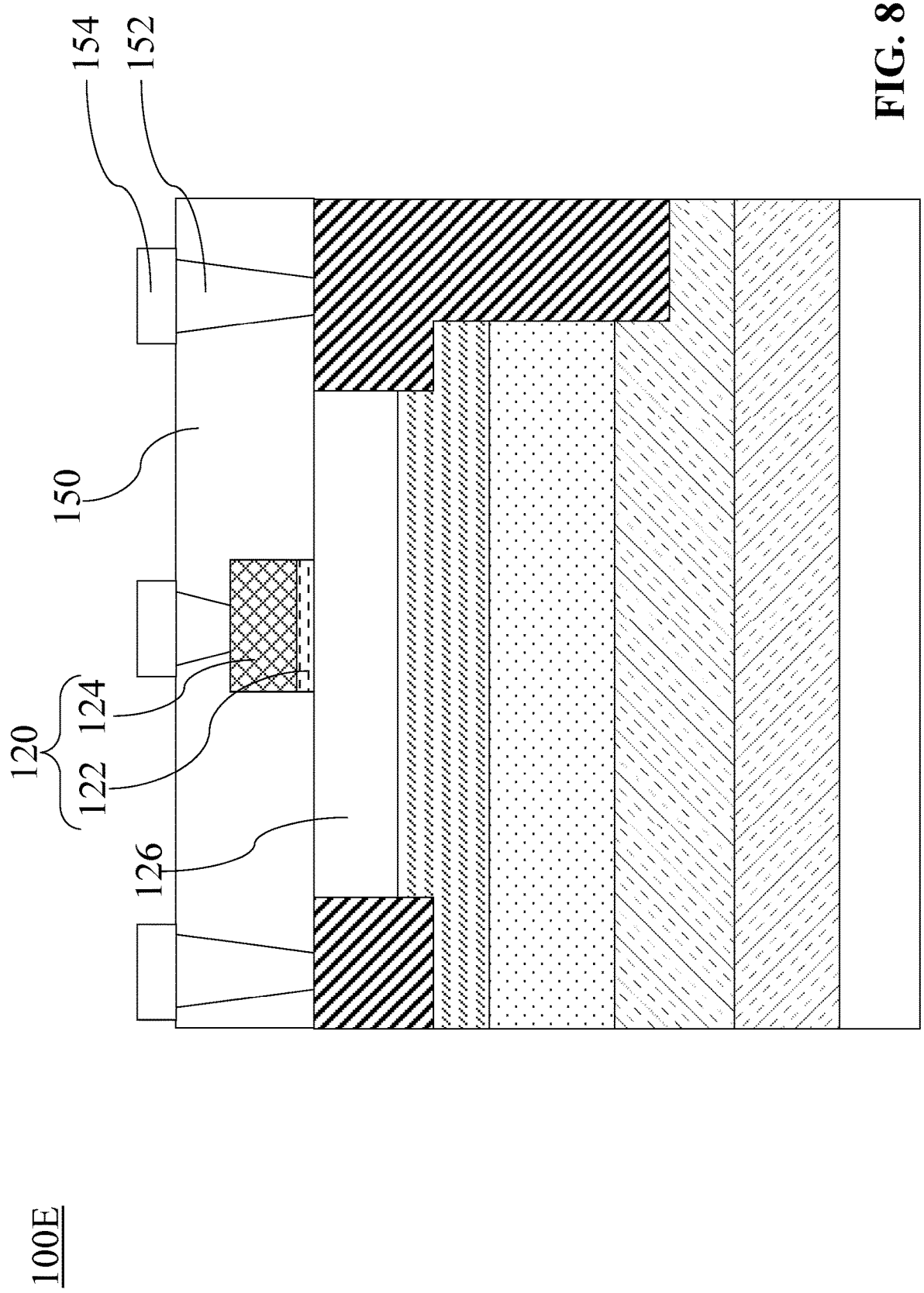
FIG. 8 is a cross-sectional view of a semiconductor device according to some embodiments of the present disclosure.

FIG. 8 is a cross-sectional view of a semiconductor device 100E according to some embodiments of the present disclosure. In the present embodiment, as shown in the exemplary illustration of FIG. 8, the gate structure 120 is disposed on the passivation layer 126. The gate structure 120 is covered by the passivation layer 150. The via 152 electrically connecting the gate structure 120 and the patterned conductive layer 154 is shorter than other vias 152.

Figure 9:
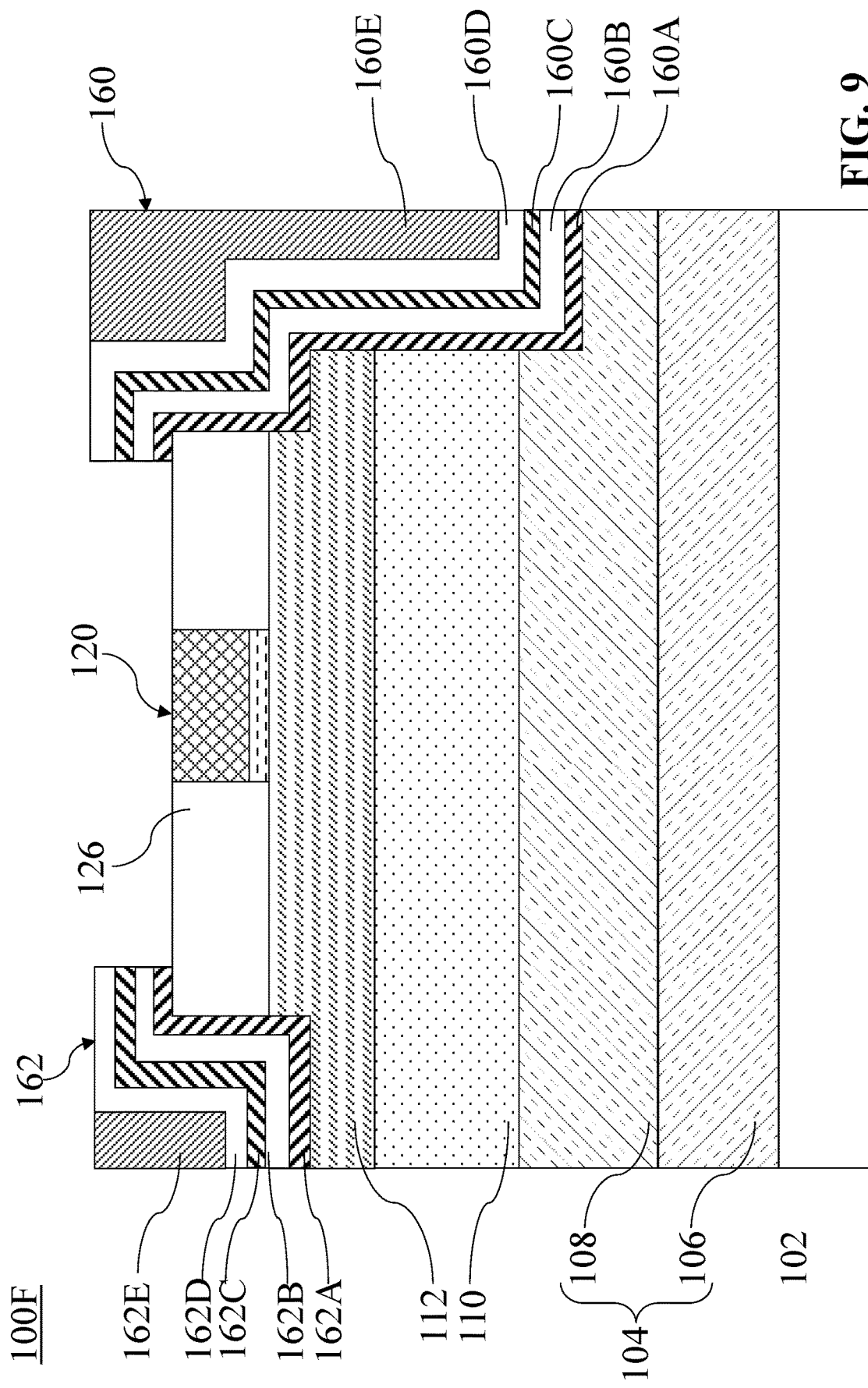
FIG. 9 is a cross-sectional view of a semiconductor device according to some embodiments of the present disclosure.

FIG. 9 is a cross-sectional view of a semiconductor device 100F according to some embodiments of the present disclosure. In the present embodiment, as shown in the exemplary illustration of FIG. 9, S/D electrodes 160 and 162 are located at two opposite sides of the gate structure 120, in which the S/D electrode 160 forms at least one interface with the top-most portion 108 of the buffer 104. The configuration of the S/D electrodes 160 and 162 are asymmetric with respect to the gate structure 120. More specifically, each of the S/D electrodes 160 and 162 is formed by at least one conformal layer and a conductive filling. The conformal layers and the conductive filling of the S/D electrodes 160 may have different features than those of the S/D electrodes 162, and thus it is called "being asymmetric with respect to the gate structure 120."

The S/D electrode 160 includes conformal layers 160A, 160B, 160C, 160D, and a conductive filling 160E. The conformal layers 160A-160D, and the conductive filling 160E are stacked from the top-most portion 108 of the buffer 104 in sequence. The S/D electrode 162 includes conformal layers 162A, 162B, 162C, 162D, and a conductive filling 160E. The conformal layers 162A-162D, and the conductive filling 162E are stacked from the nitride-based semiconductor layer 112.

The conformal layers 160A and 162A may have the same material. The conformal layers 160A and 162A can be formed by forming a single blanket layer and then patterning the blanket layer. However, the conformal layer 160A may extend downward to a position lower than the conformal layers 162A, which makes the conformal layer 160A have a thickness less than that of the conformal layers 162A. For example, a portion of the conformal layers 160A extending along sidewalls of the nitride-based semiconductor layers 110, 112, and the top-most portion 108 of the buffer 104 may have a thickness less than that of a portion of the conformal layers 162A extending along a sidewall of the nitride-based semiconductor layer 112. The conformal layers 160A and 162A may extend and change direction. The conformal layer 160A can extend and change direction at the top-most portion 108 of the buffer 104, which performs a different profile than that of the conformal layers 162A.

The relationship between the conformal layers 160A and 162A can be applied to the relationship between the conformal layers 160B and 162B, between the conformal layers 160C and 162C, or between the conformal layers 160D and 162D. The exemplary materials of the conformal layer 160A or 162A can include, for example but are not limited to, Ti, Ta, or combinations thereof. The exemplary materials of the conformal layer 160B or 162B can include, for example but are not limited to, Al, AlSi, or combinations thereof. The exemplary materials of the conformal layer 160C or 162C can include, for example but are not limited to, Ti, Ni, Pt, or combinations thereof. The exemplary materials of the conformal layer 160D or 162D can include, for example but are not limited to, TiN, Au, or combinations thereof.

The conductive fillings 160E and 162E may have the same material. The exemplary materials of the conductive fillings 160E or 162E can include, for example but are not limited to, AlSi, AlCu, or combinations thereof. The conductive fillings 160E and 162E can be formed by forming a single blanket layer and then performing a planarization process on the blanket layer. However, the conductive filling 160E may further extend downward to a position lower than the conductive filling 162E, which makes the conductive filling 160E have a thickness greater than that of the conductive fillings 162E. Furthermore, since the conformal layers 160A-160D collectively have a profile different from a profile of the conformal layers 162A-162D, the conductive fillings 160E and 162E can have different shapes. The conductive filling 160E may be approximately T-shaped in the cross sectional view. The conductive filling 162E may be approximately rectangular in the cross sectional view.

The above embodiments are to provide a semiconductor device including a S/D electrode in contact with a top-most portion of buffer, which makes the electrode electrically couple to the buffer. The above embodiments describe semiconductor devices with different configurations. These embodiments are not mutually exclusive but can be combined with each other. For example, the vias and the conductive layer illustrated in FIG. 8 can be applied to the structure illustrated in FIG. 9.

Figure 10:
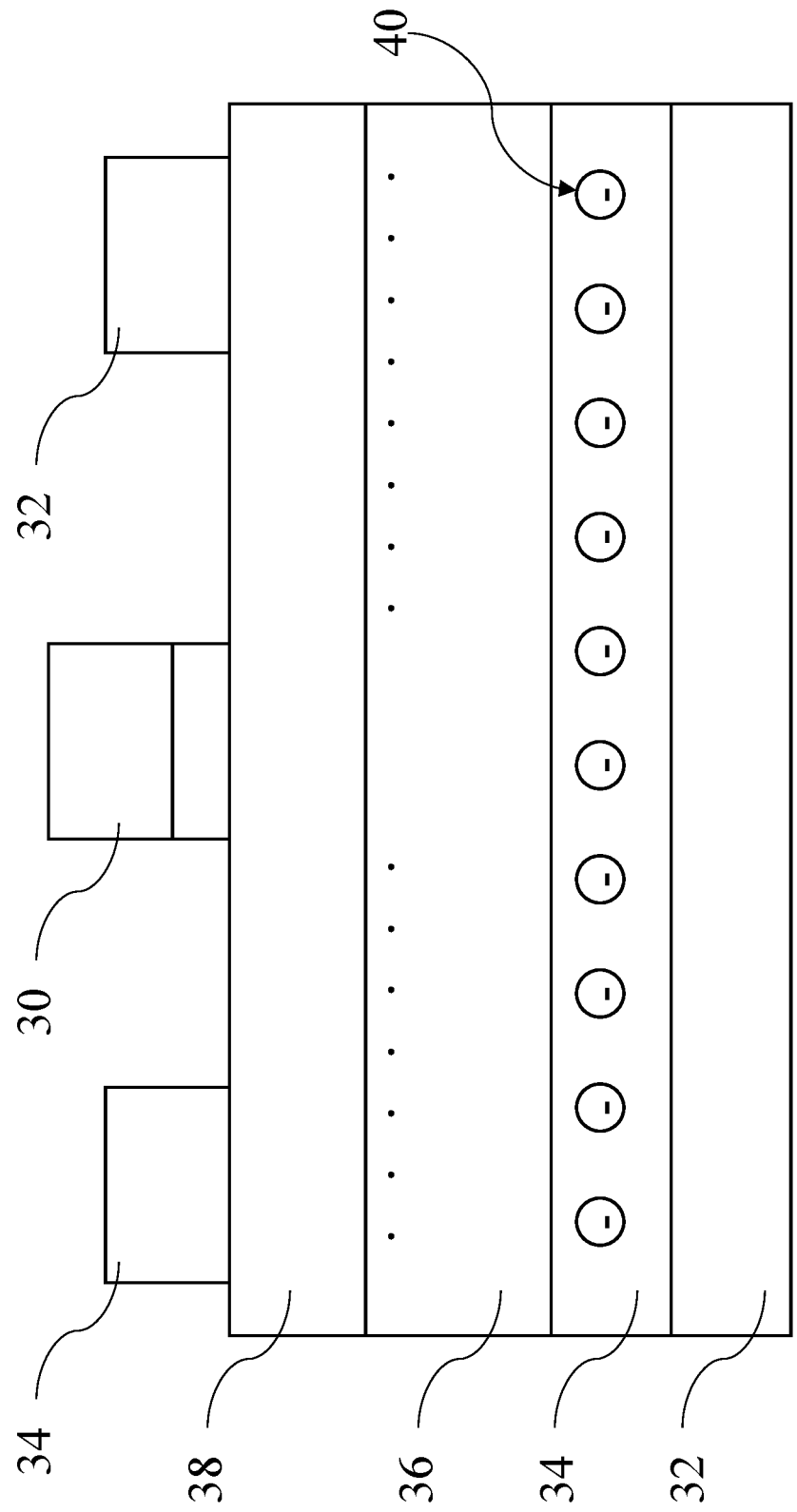
FIG. 10 is a cross-sectional view schematically showing a semiconductor device according to a comparative embodiment.

In addition to the parasitic p-n junction diode, defects in a buffer may affect a 2DEG region, further impacting the dynamic Ron peak issue as well. To illustrate this impact, FIG. 10 is a cross-sectional view schematically showing a semiconductor device 30 according to a comparative embodiment. The semiconductor device 30 includes a substrate 32, a buffer 34, nitride-based semiconductor layer 36 and 38, a gate structure 30, and a pair of S/D electrodes 32 and 34, in which a 2DEG region is formed at an interface between the nitride-based semiconductor layers 36 and 38. The buffer 34 may have defects 40 inside. In the semiconductor field, defects are almost unavoidable due to process variations. The defects 40 may serve as attraction centers for free electrons or holes, which would further affect the concentration of the 2DEG region.

Since such defects do not involve "biasing" (or reverse biasing) or a parasitic p-n junction diode, the operation of the semiconductor device 30 would be affected in a wide voltage range. For example, a parasitic p-n junction diode may affect a semiconductor device at about 100V. However, the defects 40 may affect the semiconductor device 30 in a voltage range between 0V to about 800V (or more). That is, the performance of the semiconductor device 30 would be further affected by the defects 40 in the whole operation range of the device.

Figure 11:
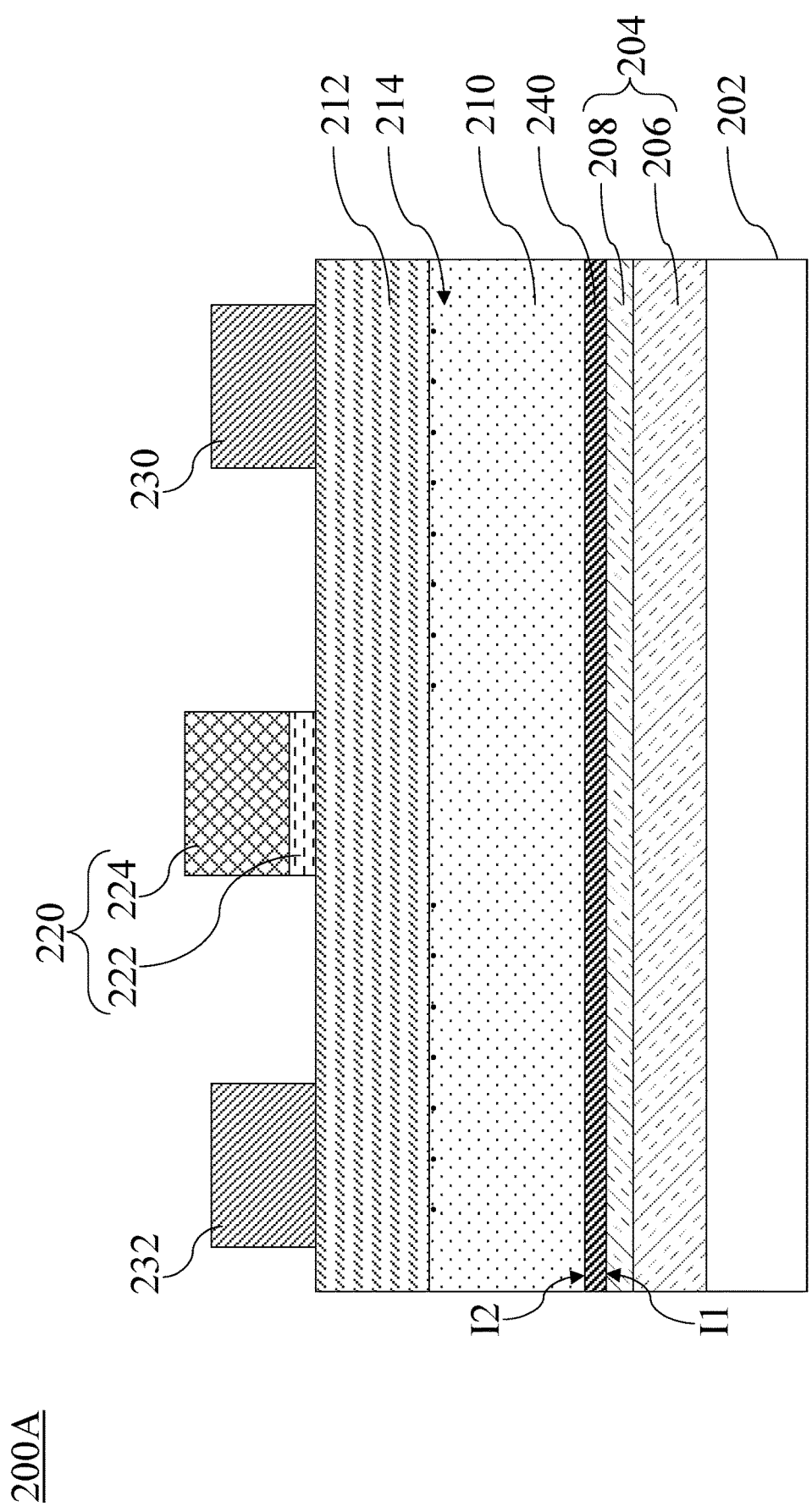
FIG. 11 is a cross-sectional view of a semiconductor device according to some embodiments of the present disclosure.

Reference is made to FIG. 11, which is a cross-sectional view of a semiconductor device 200A according to some embodiments of the present disclosure. The semiconductor device 200A includes a substrate 202, a buffer 204, nitride-based semiconductor layers 210, 212, a gate structure 220, a pair of S/D electrodes 230 and 232, and a shield layer 240.

The substrate 202 can be identical or similar to the substrate 102 as described above. The buffer 204 includes a bottom portion 206 and a top-most portion 208, which can be identical or similar to the buffer 104 as previously described. In some embodiments, the top-most portion 208 can be omitted, and hence a top-most surface of the buffer 204 would coincide with the bottom portion 206.

The nitride-based semiconductor layers 210, 212 are disposed over the buffer 204. The exemplary materials of the nitride-based semiconductor layers 210, 212 can be identical or similar to those of the nitride-based semiconductor layers 110, 112 as aforementioned, so as to form a 2DEG region 214 therebetween.

The gate structure 220 is disposed on the nitride-based semiconductor layer 212. The gate structure 220 optionally includes a p-type doped III-V compound semiconductor layer 222 and a conductive gate 224, which can be identical with or similar to the p-type doped III-V compound semiconductor layer 122 and the conductive gate 124 as aforementioned. The p-type doped III-V compound semiconductor layer 222 can provide an enhancement-mode for the semiconductor device 200A. The S/D electrodes 230 and 232 are disposed on the nitride-based semiconductor layer 212 and located at opposite sides of the gate structure 220. The gate structure 220, and the S/D electrodes 230 and 232 can collectively serve as a HEMT device with the 2DEG region 214.

To clarify the illustration of FIG. 11, S/D electrodes 230 and 232 are above the nitride-based semiconductor layer 212 without extending downward, but the present disclosure is not limited to this structure. In other embodiments, the S/D electrode 230 extending downward can be introduced into the exemplary illustration of FIG. 11 or other structure configurations of the present disclosure may be used in connection with FIG. 11.

The shield layer 240 is disposed between the buffer 204 and the nitride-based semiconductor layer 210. As previously described, the buffer 204 may create a parasitic p-n junction diode or include defects serving as attraction centers for free electrons or holes. The shield layer 240 is formed for curing such deficiencies, which can cut an electrical path/carrier path from the buffer 204 to the nitride-based semiconductor layer 210.

The exemplary materials of the shield layer 240 can be selected from those having a bandgap greater than those of the buffer 204 and the nitride-based semiconductor layer 210, so as to act as an electrical shield layer/electrical isolation region therebetween. The shield layer 240 may include an isolation compound. The isolation compound can have a bandgap greater than a bandgap of the buffer 204. The isolation compound can have a bandgap greater than a bandgap of the nitride-based semiconductor layer 210. The isolation compound can have a bandgap greater than a bandgap of the nitride-based semiconductor layer 212. Moreover, since the shield layer 240 is in direct contact with the nitride-based semiconductor layer 210, the isolation compound has to facilitate growth of the nitride-based semiconductor layer 210 thereon.

To satisfy these features, in some embodiments, the isolation compound can be made of at least one approximately two-dimensional material layer which comprises at least one metal element. The two-dimensional material layer can be formed in an atomically thin film, which can achieve a single or double atom layer. Such a thin film would allow a nitride-based layer (e.g. a GaN or AlGaN layer) to epitaxially grow thereon. This is because a single or double atom layer is thin enough such that a nitride-based layer can be epitaxially formed on the two-dimensional material while it sacrifices dislocation to a slight degree (i.e., dislocations may increase slightly). Moreover, the two-dimensional material in a single or double atom layer can serve as a step, which can promote GaN step-flow growth such that the epitaxial growth of GaN thereon is available. In this regard, although dislocations may increase slightly, the positive benefit resulting from the improvement to the dynamic Ron peak issue is greater than the negative impace of slightly increasing dislocations. Consequently, the use of shield layer 240 improves the performance of the semiconductor device 200A.

In some embodiments, with respect to the two-dimensional material having the above features, a binary compound can be chosen for the isolation compound, with the metal component including boron, zirconium, or hafnium. The isolation compound may be, for example, but is not limited to, boron nitride (BN), zirconium pentatelluride ($ZrTe_5$), or hafnium pentatelluride ($HfTe_5$). Concerning the thickness of the shield layer 240, the shield layer 240 is substantially thinner than the buffer 204, and the nitride-based semiconductor layers 210 and 212. In some embodiments, the shield layer 240 has a thickness in a range from about 0.01 nm to about 1 nm.

In addition to choosing the two-dimensional material to form the shield layer 240, an isolation compound including a group III element and oxygen can be applied to the shield layer 240. The group III element can provide a contribution regarding lattice match to a nitride-based layer to be epitaxially formed on the shield layer 240. The oxygen can bond with the group III element to cause the shield layer 240 to have an electrical isolation property. In such configuration, the shield layer 240 may have an isolation compound that is made of aluminum oxide ($Al_2O_3$) or aluminum oxynitride (AlON).

Briefly, two of the factors for permitting direct formation of the nitride-based semiconductor layer 210 on the shield layer 240 include the material selection and the thickness of the shield layer 240.

In embodiments where the top-most portion 208 of the buffer 204 includes a doped nitride-based semiconductor compound, the shield layer 240 may be devoid of gallium and be interposed between layers including gallium. For example, if the doped nitride-based semiconductor compound in the top-most portion 208 of the buffer 204 is be a doped gallium nitride semiconductor compound, and the nitride-based semiconductor layers 210 and 212 include gallium as well, then the shield layer 240 is devoid of gallium. In some embodiments, the at least one dopant of the doped nitride-based semiconductor compound is selected from one or more of carbon, silicon, germanium, or tin.

The purpose of forming the shield layer 240 is to reduce an effect on the 2DEG region 214 from the buffer 204. That is, for a path within the 2DEG region 214 from the S/D electrode 232 to the S/D electrode 230 through the gate structure 220, the shield layer 240 can be interposed between the buffer 204 and the nitride-based semiconductor layer 210 corresponding to such path.

The gate structure 220 and the S/D electrodes 230 and 232 are positioned directly above the shield layer 240. The vertical projections of the gate structure 220 and the S/D electrodes 230 and 232 on the buffer 204 are entirely within a vertical projection of the shield layer 240 on the buffer 204. Therefore, a path from the S/D electrode 232 to the gate structure 220 through the 2DEG region 214 is directly above the shield layer 240. A path from the gate structure 220 to the S/D electrode 230 through the 2DEG region 214 is directly above the shield layer 240. Furthermore, at least one path from the buffer 204 to the 2DEG region 214 would overlap with the shield layer 240.

In a relationship among the buffer 204, the shield layer 240, and the nitride-based semiconductor layer 210, the shield layer 240 can contact with the other two. The shield layer 240 would form an interface I1 with a top-most surface of the buffer 204. The shield layer 240 would form an interface I2 with a bottom-most surface of the nitride-based semiconductor layer 210. The interfaces I1 and I2 can be separated from each other by the shield layer 240. In some embodiments, the top-most surface of the buffer 204 is entirely covered by the shield layer 240, such that the interfaces I1 and I2 are entirely separated from each other by the shield layer 240, so as to further enhance the electrical isolation. That is, the top-most surface of the buffer 204 may be entirely separated from the bottom-most surface of the nitride-based semiconductor layer 210 by the shield layer 240.

With such configuration, the shield layer 240 can block an effect of the buffer 204 on the nitride-based semiconductor layer 210. Therefore, a potential parasitic p-n junction diode across the buffer 204 and the nitride-based semiconductor layer 210 would be eliminated. Moreover, any defects in the buffer 204 would be blocked by the shield layer 240, which will be advantageous to improve the dynamic Ron peak issue.

The semiconductor device 200A, may be readily manufactured, thus the manufacturing yield can be retained. Different stages of a method for manufacturing the semiconductor device 200A are shown in FIGS. 12A-12C.

Figure 12A:
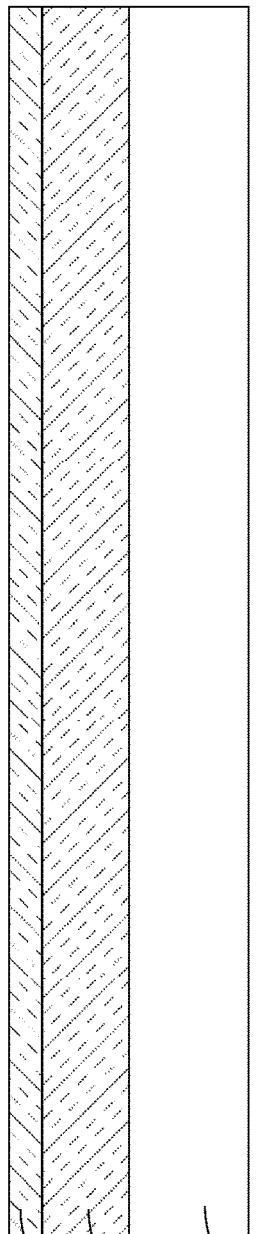
FIGS. 12A-12C illustrate different stages of a method for manufacturing a semiconductor device according to some embodiments of the present disclosure.

Referring to FIG. 12A, a substrate 202 is provided. A buffer 204 is formed above the substrate 202. The buffer 204 includes a bottom portion 206 and a top-most portion 208 which can be formed above the substrate 202 in sequence by using deposition techniques. The deposition techniques can include, for example but are not limited to, ALD, PVD, CVD, MOCVD, epitaxial growth, or other suitable processes. In some embodiments, the top-most portion 208 can be omitted, and the process for forming the buffer 204 is terminated at the end of the growth of the bottom portion 206.

Figure 12B:
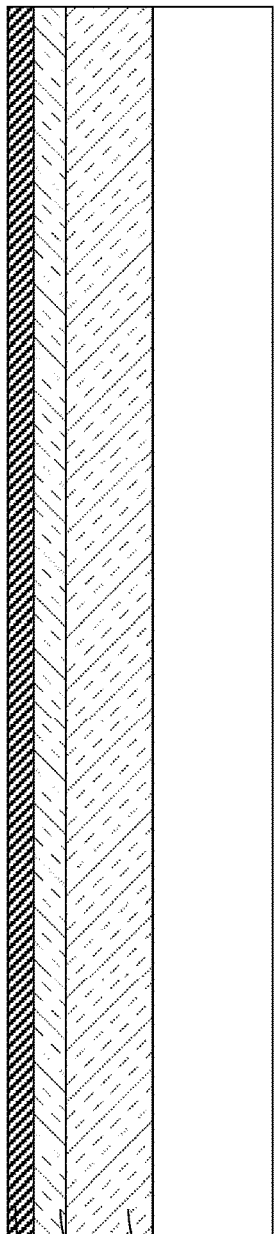

Referring to FIG. 12B, a shield layer 240 is formed on/over the buffer 204. The shield layer 240 is formed in contact with the buffer 204, so as to form an interface with the buffer 204. The shield layer 240 is formed as a blanket layer to entirely cover the buffer 204. As such, a top-most surface of the buffer 204 is entirely covered with the shield layer 240. The formation of the shield layer 240 can be achieved by using deposition techniques. The deposition techniques can include, for example but are not limited to, ALD, PVD, CVD, MOCVD. The shield layer 240 may be formed by depositing an isolation compound which is made of at least one two-dimensional material as aforementioned.

Figure 12C:
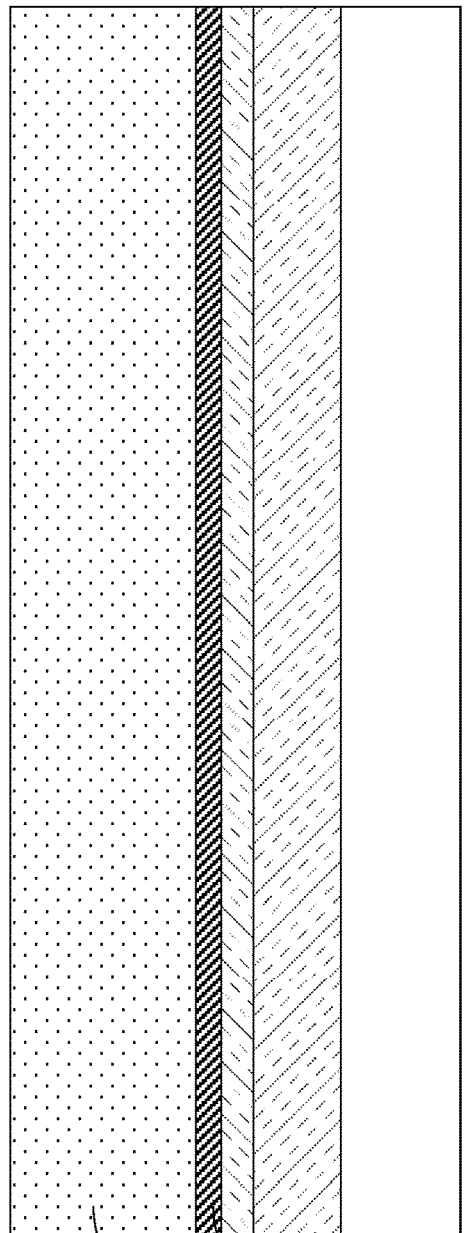

Referring to FIG. 12C, a nitride-based semiconductor layer 210 is formed on the shield layer 240. The nitride-based semiconductor layer 210 is formed by separating the buffer 204 using the shield layer 240. The nitride-based semiconductor layers 210 can directly grow from the shield layer 240. The nitride-based semiconductor layers 210 can grow to have a desired thickness. The nitride-based semiconductor layer 210 can be formed by using deposition techniques. The deposition techniques can include, for example but are not limited to, ALD, PVD, CVD, MOCVD.

After the formation of the nitride-based semiconductor layers 210, the nitride-based semiconductor layer 212, a gate structure 220, a pair of S/D electrodes 230 and 232 can be formed on/above/over the nitride-based semiconductor layers 210, which are similar to the processes previously described.

Figure 13:
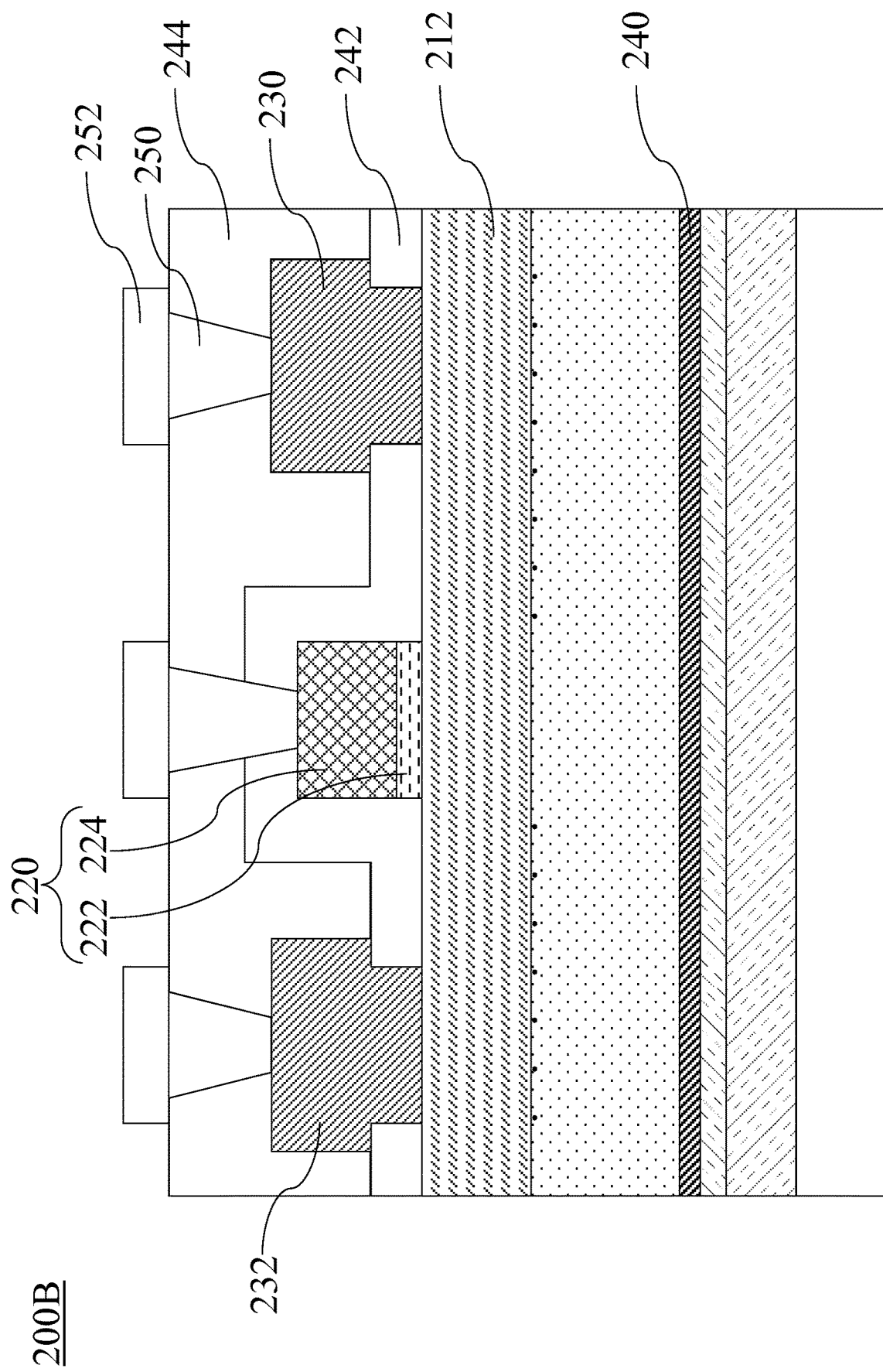
FIG. 13 is a cross-sectional view of a semiconductor device according to some embodiments of the present disclosure.

FIG. 13 is a cross-sectional view of a semiconductor device 200B according to some embodiments of the present disclosure. In the present embodiment, as shown in the exemplary illustration of FIG. 13, passivation layers 242 and 244, vias 250, and a patterned conductive layer 252 are formed on the nitride-based semiconductor layer 212. The passivation layer 242 is formed to cover the nitride-based semiconductor layer 212 and the gate structure 220. The S/D electrodes 230 and 232 penetrate the passivation layer 242 to make contact with the nitride-based semiconductor layer 212. The passivation layer 244 is disposed on the passivation layer 242. The passivation layer 244 covers the passivation layer 242 and the S/D electrodes 230 and 232.

Although the passivation layers 242 and 244 are formed primarily for an electrical isolation purpose (e.g. for electrically isolating a bottom layer and an upper layer), which is similar to the reason for forming the shield layer 240, they may have different materials from those of shield layer 240. In this regard, the passivation layers 242 and 244 may include an isolation compound different than the isolation compound used in the shield layer 240. For example, in some embodiments, the shield layer 240 may include boron while the passivation layers 242 and 244 are devoid of boron. In some embodiments, at least one of the passivation layers 242 and 244 may include silicon (e.g. $SiN_x$, $SiO_x$, SiON, SiC) while the shield layer 240 is devoid of silicon. Moreover, the shield layer 240 is formed having a thickness substantially less than any one of the passivation layers 242 and 244. The exemplary materials of the passivation layer 242 or 244 can include, for example but are not limited to, $SiN_x$, $SiO_x$, SiON, SiC, SiBN, SiCBN, oxides, nitrides, or combinations thereof. In some embodiments, the passivation layer 242 or 244 is a multi-layered structure, such as a composite dielectric layer of $Al_2O_3$/SiN, $Al_2O_3$/$SiO_2$, AlN/SiN, AlN/$SiO_2$, or combinations thereof. In some embodiments, the passivation layer 242 and 244 can be formed by using deposition techniques. The deposition techniques can include, for example but are not limited to, ALD, PVD, CVD, MOCVD, epitaxial growth, or other suitable processes.

The vias 250 are disposed within the passivation layer 244. The vias 250 penetrate the passivation layer 244. The vias 250 extend longitudinally to electrically couple with the gate structure 220 and the S/D electrodes 230 and 232, respectively. Tops of the vias 250 are free from coverage of the passivation layer 244. The exemplary materials of the vias 250 can include, for example but are not limited to, conductive materials, such as metals or alloys. The formation of the vias 250 includes forming a conductive layer within and over the passivation layer 250 and removing the excess portions of the conductive layer. In some embodiments, a planarization process is performed to remove the excess portions of the conductive layer. In some embodiments, the planarization process includes a CMP process.

A patterned conductive layer 252 is disposed on the passivation layer 244 and the vias 250. The patterned conductive layer 252 is in contact with the vias 250. The formation of the patterned conductive layer 252 includes forming a blanket conductive layer on the passivation layer 244 by using deposition techniques. The deposition techniques can include, for example but are not limited to, ALD, PVD, CVD, MOCVD, epitaxial growth, or other suitable processes. A patterning process is performed on the blanket conductive layer to form the patterned conductive layer 252 including metal lines in contact with the vias 250, respectively. The patterning process can be performed by photolithography, exposure and development, etching, other suitable processes, or combinations thereof. In some embodiments, the patterned conductive layer 252 may serve as pads or traces.

Figure 14A:
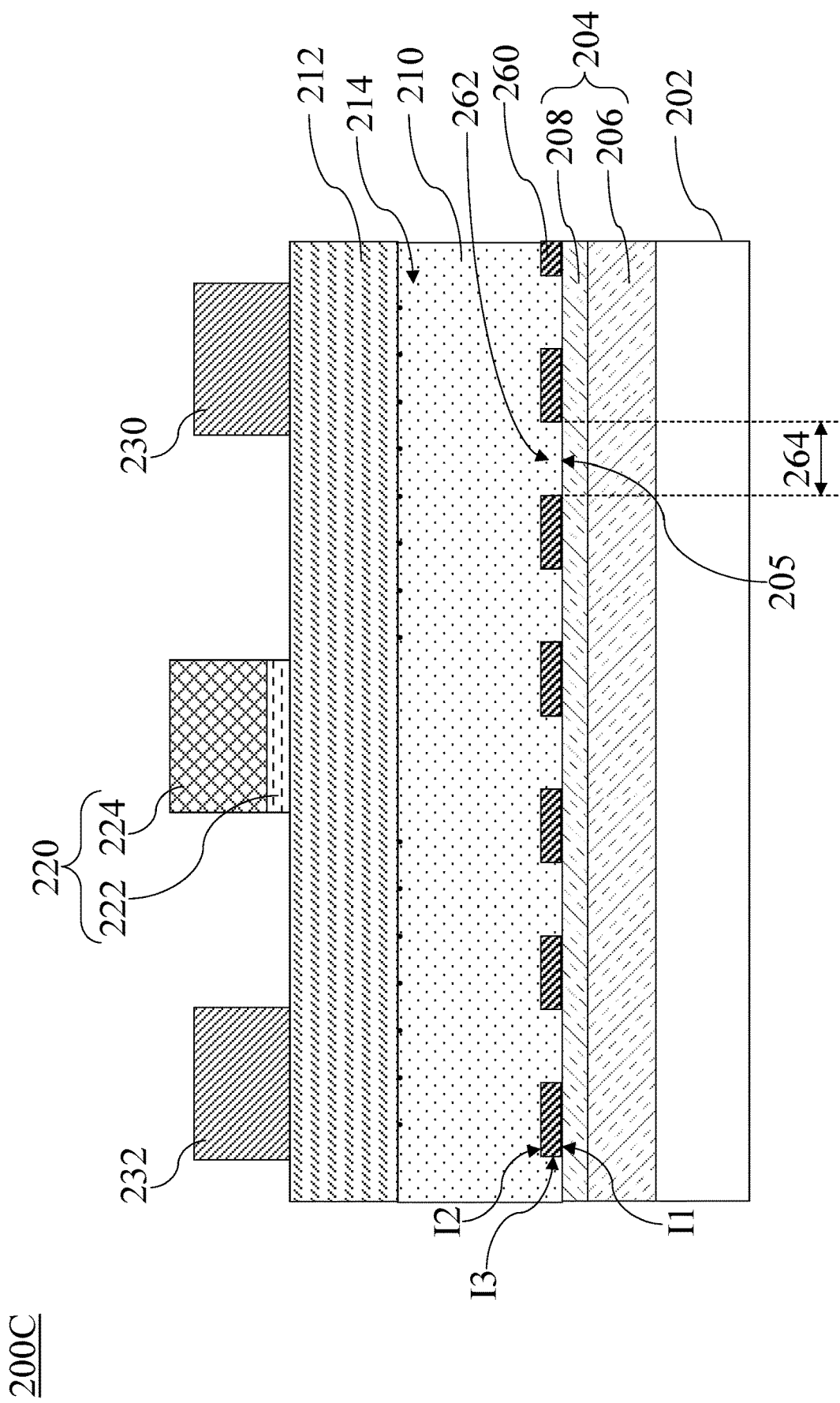
FIG. 14A is a cross-sectional view of a semiconductor device according to some embodiments of the present disclosure.

FIG. 14A is a cross-sectional view of a semiconductor device 200C according to some embodiments of the present disclosure. The semiconductor device 200C includes a substrate 202, a buffer 204, nitride-based semiconductor layers 210, 212, a gate structure 220, a pair of S/D electrodes 230 and 232, and a shield layer 260. The configuration of the semiconductor device 200C with respect to the substrate 202, the buffer 204, the nitride-based semiconductor layers 210, 212, the gate structure 220, and the S/D electrodes 230 and 232 can be identical or similar to that of the semiconductor device 200A, described above. In some embodiments, the top-most portion 208 can be omitted, and a top-most surface of the buffer 204 coincides with the bottom portion 206.

The shield layer 260 is interposed between the buffer 204 and the nitride-based semiconductor layer 210. The shield layer 260 is formed for curing the deficiencies regarding formation of a parasitic p-n junction diode or layer defects, so as to mitigate the dynamic Ron peak.

The exemplary materials of the shield layer 260 can be selected as having a bandgap greater than those of the buffer 204 and the nitride-based semiconductor layer 210, so as to act as an electrical shield layer/electrical isolation region therebetween. The shield layer 260 includes an isolation compound. The isolation compound can have a bandgap greater than a bandgap of the buffer 204. The isolation compound can have the bandgap greater than a bandgap of the nitride-based semiconductor layer 210. The isolation compound can have the bandgap greater than a bandgap of the nitride-based semiconductor layer 212.

Figure 14B:
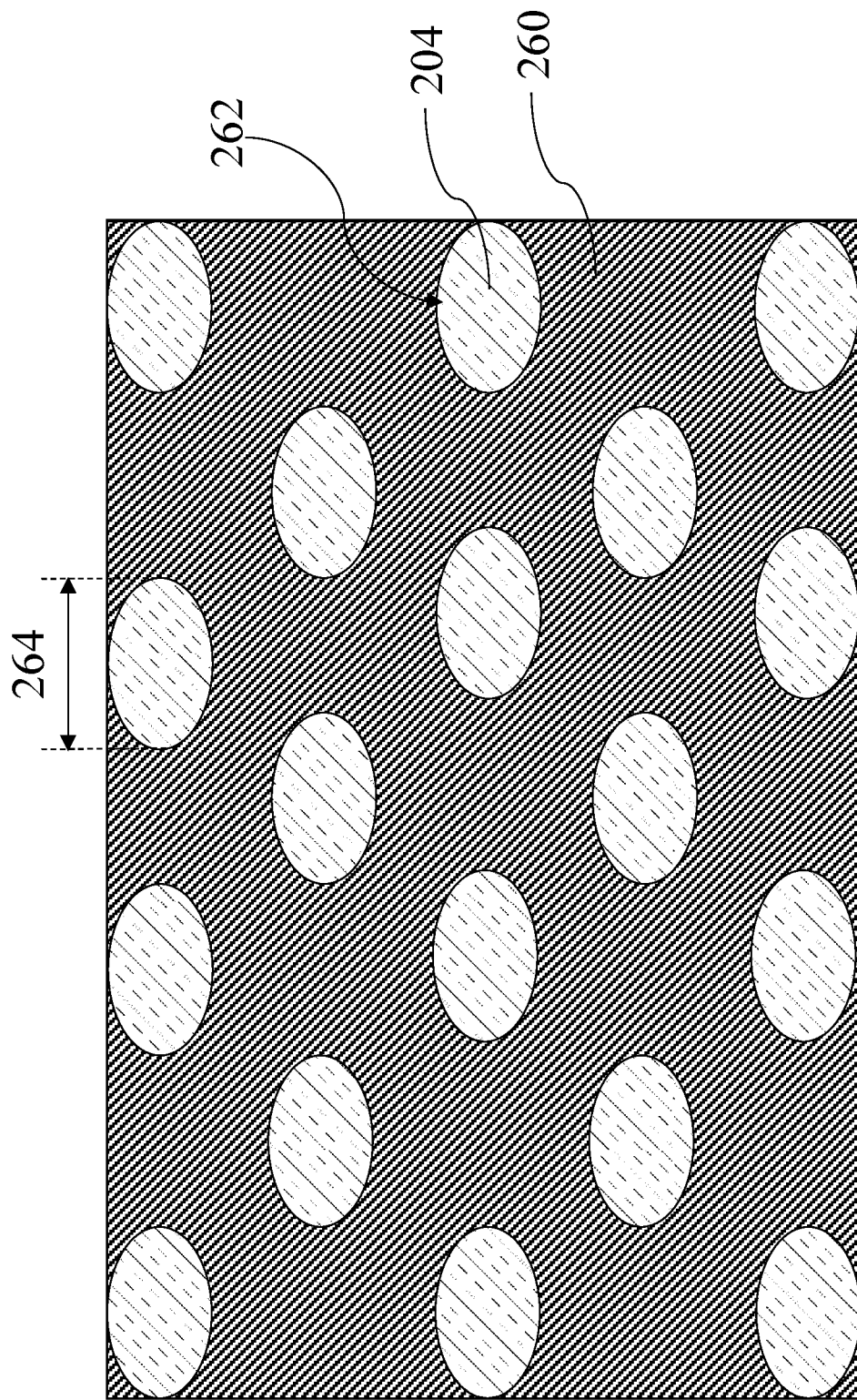
FIG. 14B is a plan view of the buffer and the shield layer of FIG. 14A.

In the exemplary illustration of FIG. 14A, the selection of the materials of the shield layer 260 is flexible, because the nitride-based semiconductor layer 210 can grow using the buffer 204. More specifically, FIG. 14B is a plan view of the buffer 204 and the shield layer 260 of FIG. 14A. The viewing direction is along a direction normal to the substrate 202 and passes the shield layer 260 and then the buffer 204. The shield layer 260 has a plurality of apertures 262 to expose the buffer 204. Some portions of a top-most surface of the buffer 204 are covered by the shield layer 260. That is, the isolation layer shield layer 260 can have at least one inner boundary surrounding the buffer 204. The shield layer 260 can be referred to as a patterned layer. Each of the apertures 262 can be arranged as having an interval 264.

Referring back to FIG. 14A, the buffer 204 and the nitride-based semiconductor layer 210 can form at least one interface 205 with each other through the intervals 264 of apertures 262.

That is, the nitride-based semiconductor layer 210 can grow using buffer 204 at the interface 205, which means the growth of the nitride-based semiconductor layer 210 does not totally depend on the properties of the shield layer 260. Therefore, the shield layer 260 can be made of an isolation compound which can include, for example but is not limited to, $SiO_2$, SiN, $Al_2O_3$, AlON, or other electrically insulating materials. In some embodiments, the isolation compound is made of at least one dielectric material such that the shield layer 260 has resistance greater than that of the buffer 204 or the nitride-based semiconductor layer 210, that is, a conductivity less than that of either the buffer 204 or the nitride-based semiconductor layer 210.

In some embodiments involving the top-most portion 208 of the buffer 204 includes a doped nitride-based semiconductor compound, the shield layer 260 may be devoid of gallium and be interposed between the layers that include gallium. For example, when the doped nitride-based semiconductor compound in the top-most portion 208 of the buffer 204 is a doped gallium nitride semiconductor compound, and the nitride-based semiconductor layers 210 and 212 include gallium as well, the shield layer 260 is devoid of gallium. In some embodiments, the at least one dopant of the doped nitride-based semiconductor compound is selected from one or more of carbon, silicon, germanium, or tin. The shield layer 260 can have a flexible thickness range. In some embodiments, the thickness of the shield layer 260 is in a range from about 1 nm to about 100 nm.

The shield layer 260 can act as an electrical isolation region between the buffer 204 and the nitride-based semiconductor layer 210 for improving the dynamic Ron peak. Further, during the growth of the nitride-based semiconductor layer 210, the nitride-based semiconductor layer 210 can grow to gradually fill the intervals 264 of the holes 262. As the nitride-based semiconductor layer 210 grows in a position above the shield layer 260, the nitride-based semiconductor layer 210 starts to epitaxially grow laterally over the shield layer 260. An advantage of such approach is that any dislocation lines in the buffer 204 (i.e. which is a growth defect in the buffer 204) only can propagate to the nitride-based semiconductor layer 210 through the intervals 264 of the holes 262. That is, at least one dislocation line directly below the shield layer 260 would be blocked by the shield layer 260. Accordingly, a defect density in the nitride-based semiconductor layer 210 resulting from the dislocation lines is reduced, thereby increasing the quality of the nitride-based semiconductor layer 210 and improving the performance of the semiconductor device 200C.

In the configuration of FIG. 14A, the interface 205 is formed in a position lower than a top-most surface of the shield layer 260. With respect to the nitride-based semiconductor layer 212, the nitride-based semiconductor layer 210 extends downward to penetrate the shield layer 260, so as to form the interface 205 with the buffer 204. The shield layer 260 abuts against the interface 205, such that at least one path from the buffer 204 to the 2DEG region 214 is free from the isolation region.

Furthermore, the shield layer 260 may have a contact area with respect to the nitride-based semiconductor layer 210 greater than a contact area with respect to the buffer 204. The shield layer 260 forms an interface I1 with the top-most portion 208 of the buffer 204. The shield layer 260 forms interfaces I2 and I3 with a bottom-most portion of the nitride-based semiconductor layer 210 as well. The shield layer 260 has a top-most surface forming the interface I2 with the nitride-based semiconductor layer 210. The shield layer 260 has a sidewall forming the interface I3 with the nitride-based semiconductor layer 210. The interface area between the shield layer 260 and the nitride-based semiconductor layer 210 is greater than interface area between the shield layer 260 and the buffer 204.

To achieve the structure of the semiconductor device 200C, no complex manufacturing process needs to be introduced, and thus a yield rate of a manufacturing process for the semiconductor device 200C can be preserved. Different stages of a method for manufacturing the semiconductor device 200C are shown in FIGS. 15A-15E.

Figure 15A:
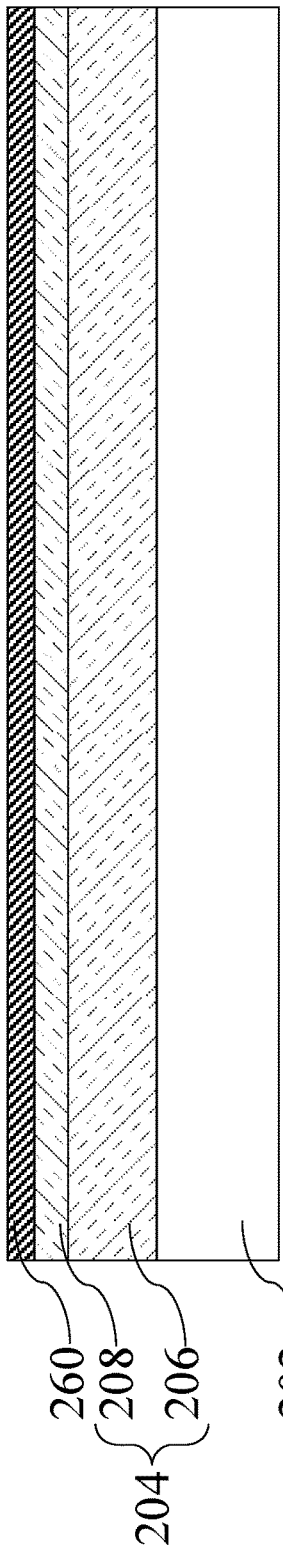
FIGS. 15A-15E illustrate different stages of a method for manufacturing a semiconductor device according to some embodiments of the present disclosure.

Referring to FIG. 15A, a substrate 202 is provided. A buffer 204 is formed above the substrate 202. The buffer 204 includes a bottom portion 206 and a top-most portion 208 which can be formed above the substrate 202 in sequence by using deposition techniques. The deposition techniques can include, for example but are not limited to, ALD, PVD, CVD, MOCVD, epitaxial growth, or other suitable processes. In some embodiments, the top-most portion 208 can be omitted, and the process for forming the buffer 204 is terminated at the end of the growth of the bottom portion 206. Then, a shield layer 260 is formed on/over the buffer 204. The shield layer 260 is formed in contact with the buffer 204, so as to form an interface with the buffer 204. The shield layer 260 is formed as a blanket layer to entirely cover the buffer 204. The formation of the shield layer 260 can be achieved by using deposition techniques. The deposition techniques can include, for example but are not limited to, ALD, PVD, CVD, MOCVD. The shield layer 260 is formed by depositing in an isolation compound which has a bandgap greater than that of the buffer 204.

Figure 15B:
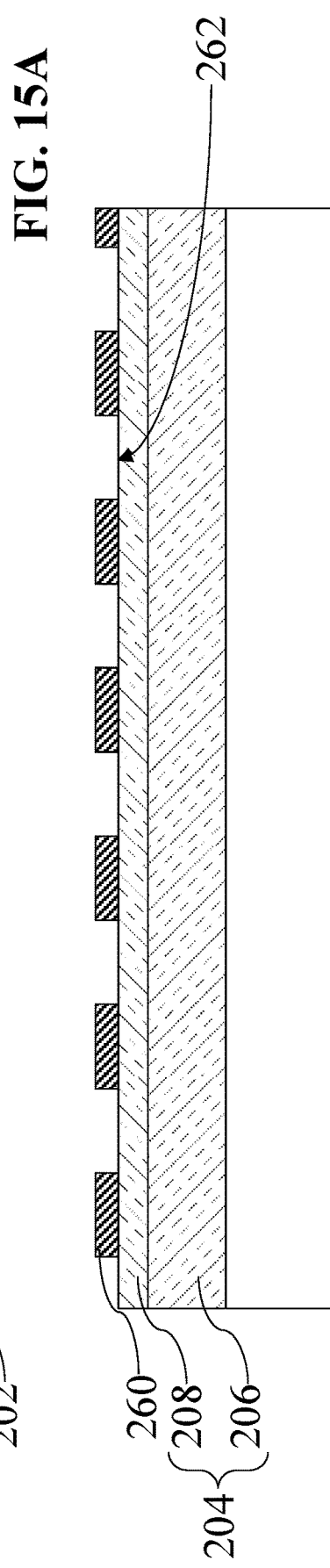

Referring to FIG. 15B, after the formation of the blank shield layer 260, a patterning process is performed on the shield layer 260 such that the shield layer 260 has a plurality of apertures 262 to expose the buffer 204. The patterning process can be performed by photolithography, exposure and development, etching, other suitable processes, or combinations thereof.

Figure 15C:
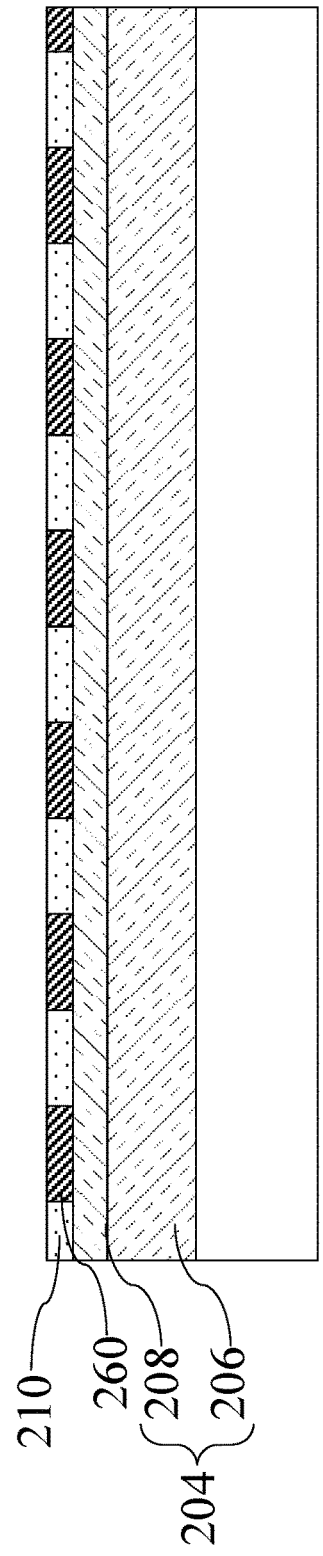

Referring to FIG. 15C, a nitride-based semiconductor layers 210 start to grow from the buffer 204. The nitride-based semiconductor layers 210 grows from the exposed buffer 204. The nitride-based semiconductor layers 210 can gradually fill the apertures 262 of the shield layer 260. The thickness of the nitride-based semiconductor layers 210 gradually increases. During the growth of the nitride-based semiconductor layers 210, a contact area between the nitride-based semiconductor layers 210 and the shield layer 260 gradually increases. The nitride-based semiconductor layers 210 can grow by using deposition techniques including, but not limited to, ALD, PVD, CVD, MOCVD.

Figure 15D:
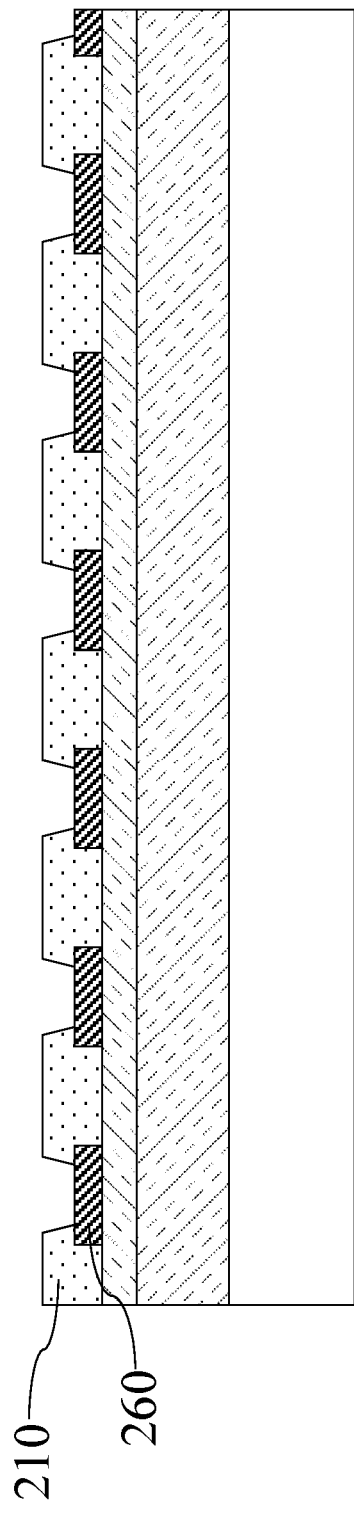
Figure 15E:
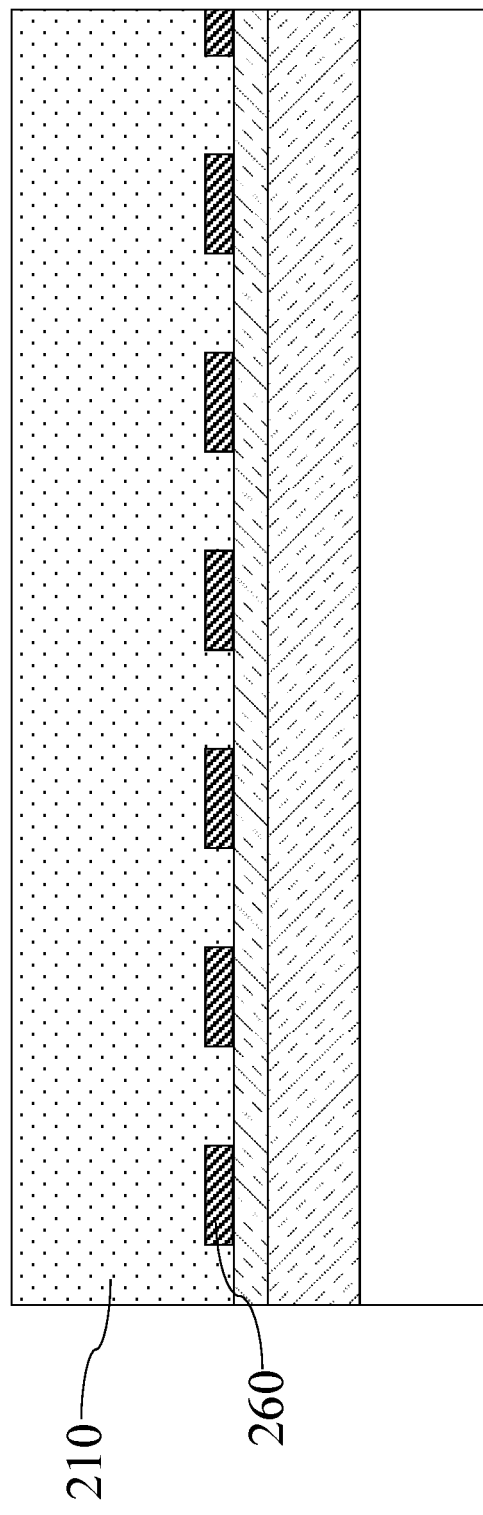

Referring to FIG. 15D, after the nitride-based semiconductor layers 210 grows at a position above the shield layer 260, the nitride-based semiconductor layer 210 would start to epitaxially grow laterally over the shield layer 260. That is, the nitride-based semiconductor layer 210 can grow laterally in a position above a top-most surface of the shield layer 260. As such, the shield layer 260 is gradually covered with the nitride-based semiconductor layer 210 as the growth expands. Eventually, the shield layer 260 is entirely covered by the nitride-based semiconductor layer 210. The nitride-based semiconductor layer 210 is formed to cover a top-most surface and a side surface of the shield layer 260. Thereafter, the nitride-based semiconductor layer 210 can grow until it reaches a desired layer thickness, as shown in FIG. 15E.

After the formation of the nitride-based semiconductor layers 210, the nitride-based semiconductor layer 212, a gate structure 220, a pair of S/D electrodes 230 and 232 can be formed on/above/over the nitride-based semiconductor layers 210, which are similar to the process as previously described.

Figure 16:
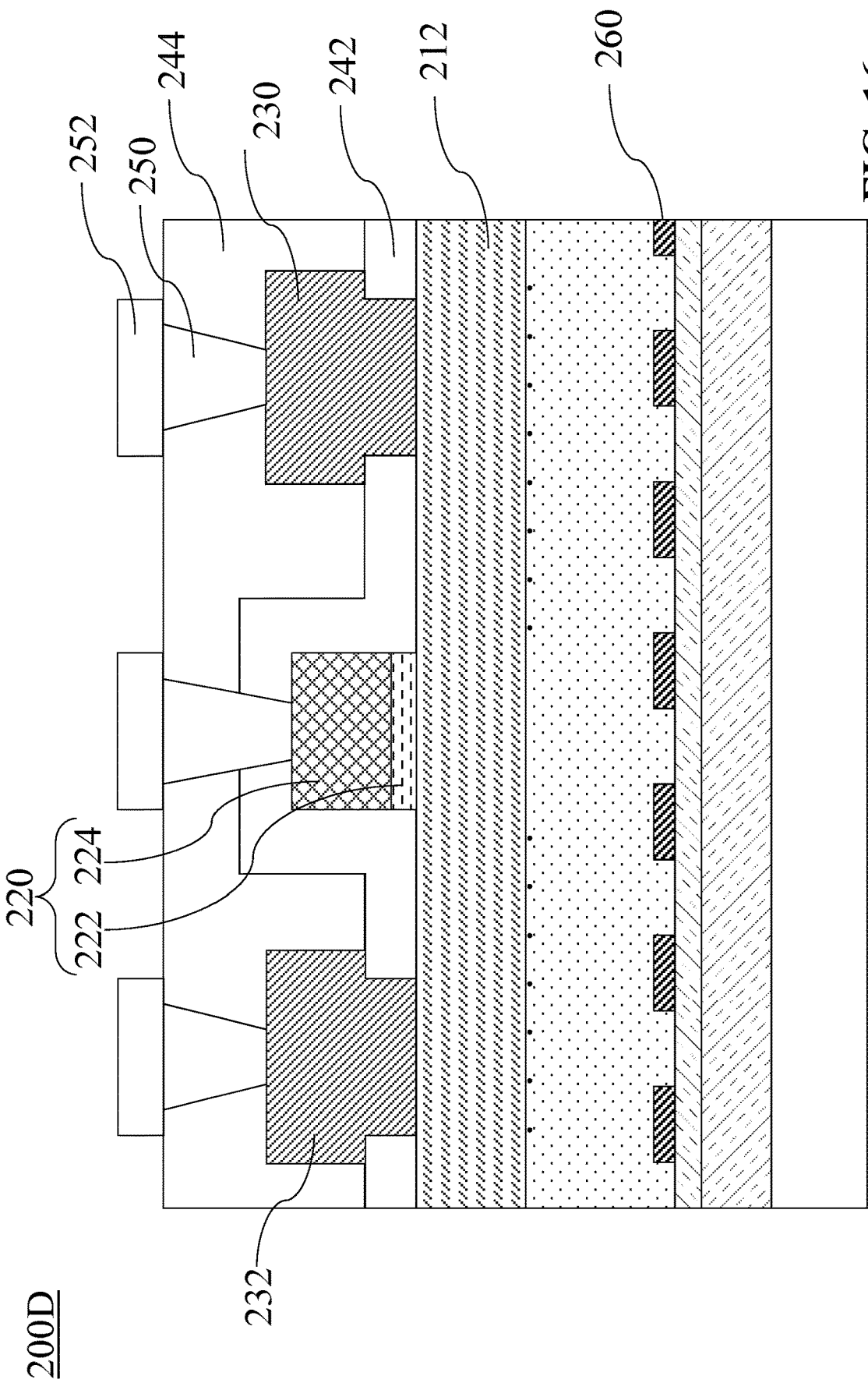
FIG. 16 is a cross-sectional view of a semiconductor device according to some embodiments of the present disclosure.

FIG. 16 is a cross-sectional view of a semiconductor device 200D according to some embodiments of the present disclosure. In the present embodiment, as shown in the exemplary illustrations of FIG. 16, passivation layers 242 and 244, vias 250, and a patterned conductive layer 252 are formed on the nitride-based semiconductor layer 212. The passivation layer 242 is formed to cover the nitride-based semiconductor layer 212 and the gate structure 220. The S/D electrodes 230 and 232 penetrate the passivation layer 242 to make contact with the nitride-based semiconductor layer 212. The passivation layer 244 is disposed on the passivation layer 242. The passivation layer 244 covers the passivation layer 242 and the S/D electrodes 230 and 232.

As described above, the passivation layers 242 and 244 can include an isolation compound different from an isolation compound in the shield layer 260. For example, in some embodiments, the shield layer 260 may include an isolation compound including at least one metal element while the passivation layers 242 and 244 may include an isolation compound devoid of metal elements. For example, the shield layer 260 may include aluminum while the passivation layers 242 and 244 may be devoid of aluminum. In other embodiments, the shield layer 260 may include an isolation compound having the same composition as that of the passivation layers 242 and 244.

The vias 250 are disposed within the passivation layer 244. The vias 250 penetrate the passivation layer 244. The vias 250 extend longitudinally to electrically couple with the gate structure 220 and the S/D electrodes 230 and 232, respectively. The tops of the vias 250 are free from coverage of the passivation layer 244. The exemplary materials of the vias 250 can include, for example but are not limited to, conductive materials, such as metals or alloys and conductive compounds. The formation of the vias 250 includes forming a conductive layer within and over the passivation layer 250 and removing the excess portions of the conductive layer. In some embodiments, a planarization process is performed to remove any excess portions of the conductive layer. In some embodiments, the planarization process includes a CMP process.

A patterned conductive layer 252 is disposed on the passivation layer 244 and the vias 250. The patterned conductive layer 252 is in contact with the vias 250. The formation of the patterned conductive layer 252 includes forming a blanket conductive layer on the passivation layer 244 by using deposition techniques. The deposition techniques can include, for example but are not limited to, ALD, PVD, CVD, MOCVD, epitaxial growth, or other suitable processes. A patterning process is performed on the blanket conductive layer to form the patterned conductive layer 252 including metal lines in contact with the vias 250, respectively. The patterning process can be performed by photolithography, exposure and development, etching, other suitable processes, or combinations thereof. In some embodiments, the patterned conductive layer 252 may serve as pads or traces.

Figure 17A:
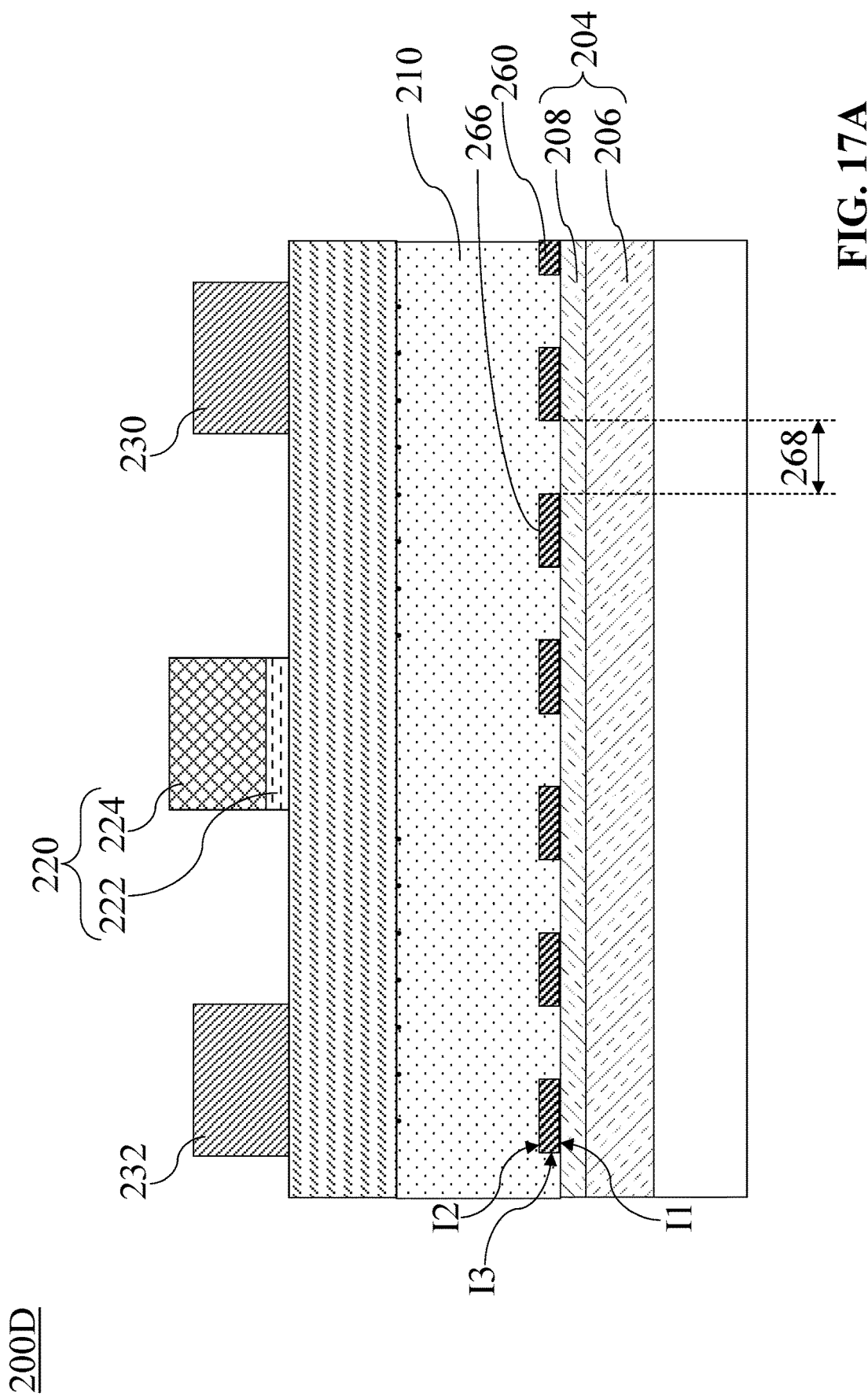
FIG. 17A is a cross-sectional view of a semiconductor device according to some embodiments of the present disclosure.
Figure 17B:
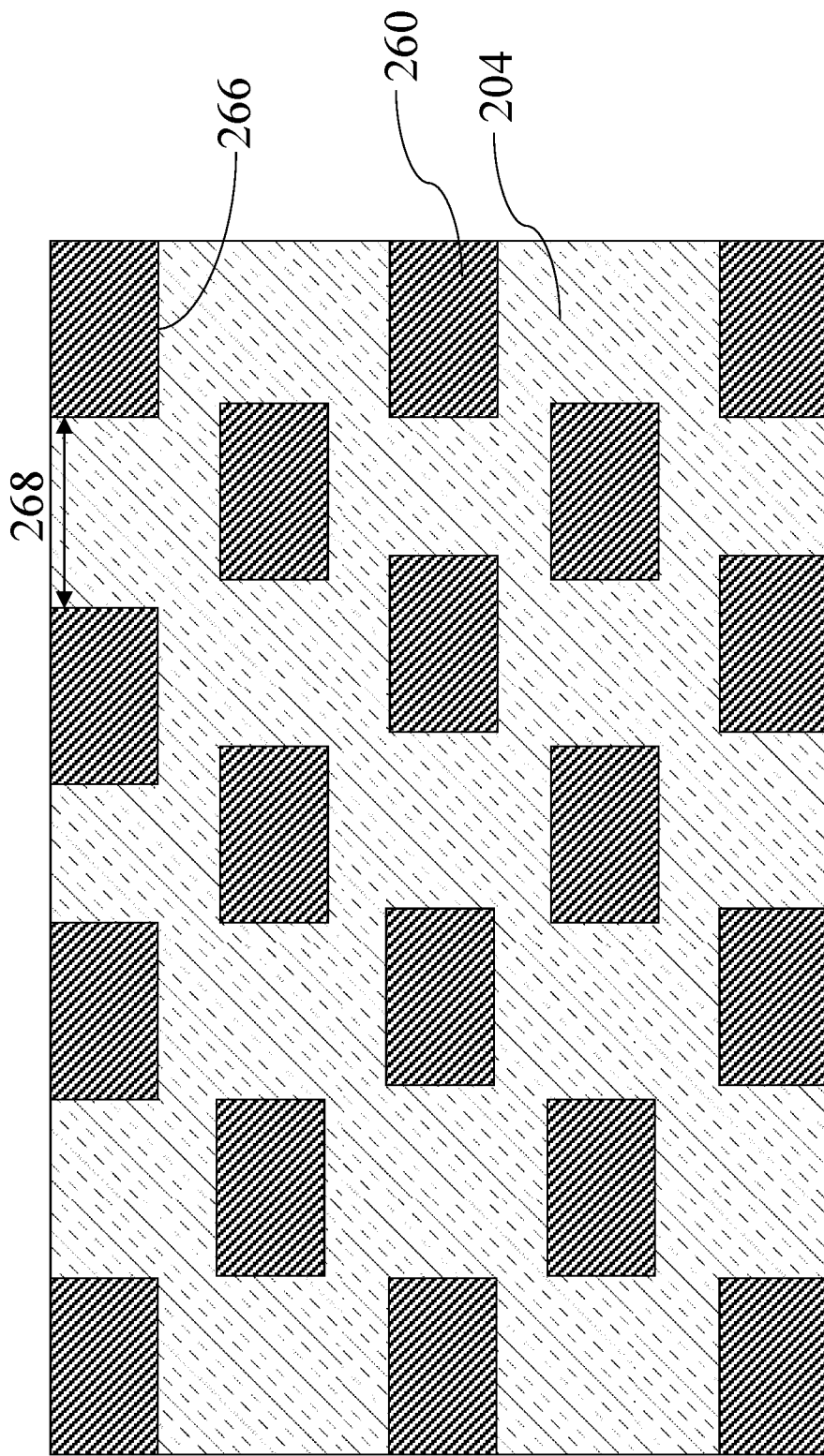
FIG. 17B is a plan view of a buffer and a shield layer of FIG. 17A.

FIG. 17A is a cross-sectional view of a semiconductor device 200D according to some embodiments of the present disclosure, and FIG. 17B is a plan view of a buffer 204 and a shield layer 260 of FIG. 17A. In the present embodiment, as shown in the exemplary illustrations of FIGS. 17A and 17B, the shield layer 260 further has a plurality of isolation islands 266. The shield layer 260 is patterned to have the isolation islands 266 separated from each other. Each pair of the two adjacent isolation islands 266 has an interval 268 therebetween. The nitride-based semiconductor layer 210 can extend downward to fully fill intervals 268 between the isolation islands 266. As such, the isolation islands 266 are enclosed by the buffer 204 and the nitride-based semiconductor layer 210.

The shield layer can be designed as being continuous (i.e. a blanket layer) or discontinuous (i.e. isolation islands), which depends on requirements of a desired semiconductor device. That is, the formation of the shield layer 240/260 provided by the present disclosure is flexible such that the shield layer 240/260 can be easily applied to a semiconductor device.

In the present disclosure, the solutions for improving the dynamic Ron peak issue are provided. These solutions have high compatibility and thus can be combined with each other. For example, a drain extending downward to a buffer can be introduced into embodiments related to a shield layer.

Figure 18A:
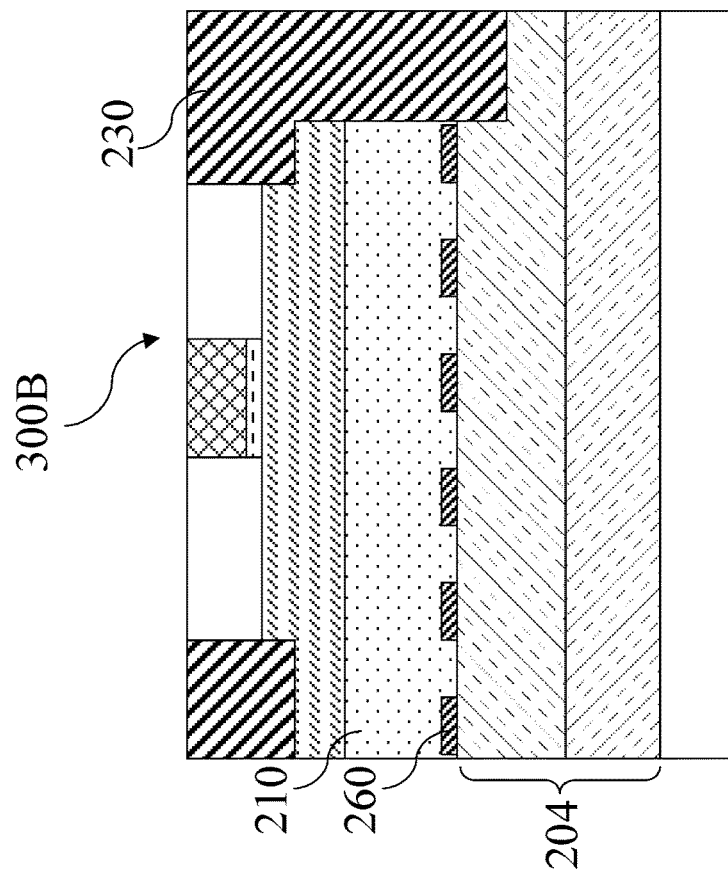
FIG. 18A is a cross-sectional view of a semiconductor device according to some embodiments of the present disclosure.

FIG. 18A is a cross-sectional view of a semiconductor device 300A according to some embodiments of the present disclosure. The semiconductor device 300A has a configuration in which a shield layer 240, which is a blanket isolation layer, is disposed between a buffer 204 and a nitride-based semiconductor layer 210 and a S/D electrode 230 extends downward to make contact with the buffer 204. The S/D electrode 230 can extend to a position lower than the shield layer 240.

Figure 18B:
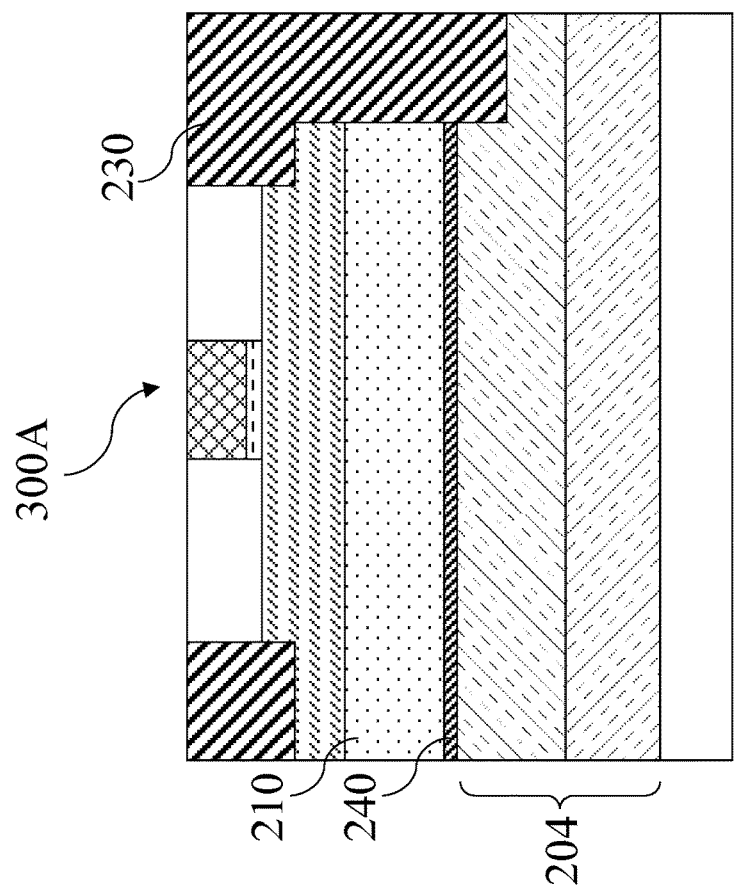
FIG. 18B is a cross-sectional view of a semiconductor device according to some embodiments of the present disclosure.

FIG. 18B is a cross-sectional view of a semiconductor device 300B according to some embodiments of the present disclosure. The semiconductor device 300B has a configuration in which a shield layer 260, which includes isolation islands, is disposed between a buffer 204 and a nitride-based semiconductor layer 210 and a S/D electrode 230 extends downward to make contact with the buffer 204. The S/D electrode 230 can extend to a position lower than the shield layer 260.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to 10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 m, within m, within 20 m, within 10 m, or within 1 m of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
a substrate;
a buffer disposed over the substrate;
a first nitride-based semiconductor layer disposed over the buffer and forming a first interface with the buffer;
a shield layer comprising a first isolation compound and interposed between the buffer and the first nitride-based semiconductor layer, wherein the first isolation compound has a bandgap greater than a bandgap of the buffer and greater than a bandgap of the first nitride-based semiconductor layer, forming at least one electrical isolation region between the buffer and the first nitride-based semiconductor layer;
a second nitride-based semiconductor layer disposed on the first nitride-based semiconductor layer and having a bandgap less than the bandgap of the first isolation compound and greater than the bandgap of the first nitride-based semiconductor layer; and
a pair of source/drain (S/D) electrodes and a gate electrode disposed over the second nitride-based semiconductor layer, wherein the gate electrode is present between the S/D electrodes.

2. The semiconductor device of claim 1, wherein the first interface is in a position lower than a top-most surface of the shield layer.

3. The semiconductor device of claim 2, wherein the shield layer forms a second interface with a top-most portion of the buffer.

4. The semiconductor device of claim 3, wherein the top-most surface of the shield layer forms a third interface with a bottom-most portion of the first nitride-based semiconductor layer, and the shield layer has a sidewall forming a fourth interface with the bottom-most portion of the first nitride-based semiconductor layer.

5. The semiconductor device of claim 1, wherein the first nitride-based semiconductor layer extends downward to a top-most surface of the buffer to form the first interface.

6. The semiconductor device of claim 1, wherein the shield layer has a plurality of isolation islands enclosed by the buffer and the first nitride-based semiconductor layer.

7. The semiconductor device of claim 6, wherein the first nitride-based semiconductor layer extends downward to fully fill intervals between the isolation islands.

8. The semiconductor device of claim 6, wherein each of the isolation islands has a first interface area with the first nitride-based semiconductor layer and a second interface area with the buffer, and the first interface area is greater than the second interface area.

9. The semiconductor device of claim 1, wherein the first nitride-based semiconductor layer extends downward to penetrate the shield layer, so as to form the first interface with the buffer.

10. The semiconductor device of claim 1, wherein the shield layer viewed along a direction normal to the substrate has at least one inner boundary surrounding the buffer.

11. The semiconductor device of claim 1, wherein the buffer comprises at least one layer of a doped nitride-based semiconductor compound at a top-most portion of the buffer, wherein at least one dopant of the doped nitride-based semiconductor compound is selected from one or more of carbon, silicon, germanium, or tin, and wherein the shield layer is in contact with the doped nitride-based semiconductor compound.

12. The semiconductor device of claim 11, wherein the doped nitride-based semiconductor compound of the buffer is carbon-doped gallium nitride.

13. The semiconductor device of claim 1, wherein the shield layer has a thickness in a range from 1 nm to 100 nm.

14. The semiconductor device of claim 1, further comprising:
a passivation layer disposed over the gate electrode and comprising a second isolation compound that is devoid of metal elements, wherein the first isolation compound comprises at least one metal element.

15. The semiconductor device of claim 1, further comprising:
a passivation layer disposed over the gate electrode and comprising a second isolation compound having the same composition as that of the first isolation compound.

16. A method for manufacturing a semiconductor device, comprising:
forming a buffer over a substrate;
forming a shield layer in contact with the buffer;
patterning the shield layer to expose portions of the buffer;
growing a first nitride-based semiconductor layer from the exposed portion of the buffer, such that the first nitride-based semiconductor layer is formed to cover the shield layer, wherein the first nitride-based semiconductor layer has a bandgap less than a bandgap of the shield layer;
forming a second nitride-based semiconductor layer on the first nitride-based semiconductor layer, wherein the second nitride-based semiconductor layer has a bandgap less than the bandgap of the shield layer and greater than the bandgap of the first nitride-based semiconductor layer;
forming two or more source/drain (S/D) electrodes over the second nitride-based semiconductor layer; and
forming a gate electrode over the second nitride-based semiconductor layer and between the S/D electrodes.

17. The method of claim 16, wherein the first nitride-based semiconductor layer is formed to cover a top-most surface and a side surface of the shield layer.

18. The method of claim 16, wherein pattering the shield layer is performed such that a plurality of isolation islands are formed.

19. The method of claim 16, wherein pattering the shield layer is performed such that the shield layer has a plurality of apertures to expose the buffer.

20. The method of claim 16, wherein the first nitride-based semiconductor layer grows laterally in a position higher than a top-most surface of the shield layer.

* * * * *